United States Patent [19]
Abe et al.

[11] Patent Number: 5,451,487
[45] Date of Patent: Sep. 19, 1995

[54] ELECTRON BEAM LITHOGRAPHIC METHOD AND APPARATUS

[75] Inventors: Takayuki Abe, Kawasaki; Satoshi Yamasaki, Yokohama, both of Japan

[73] Assignee: Kabushiki Kaisha Toshiba, Kawasaki, Japan

[21] Appl. No.: 209,360

[22] Filed: Mar. 14, 1994

Related U.S. Application Data

[63] Continuation of Ser. No. 760,993, Sep. 17, 1991, abandoned.

[30] Foreign Application Priority Data

Sep. 17, 1990 [JP] Japan .................................. 2-246437
Nov. 19, 1990 [JP] Japan .................................. 2-311563
Jan. 8, 1991 [JP] Japan .................................. 3-000732

[51] Int. Cl.⁶ .................................................. G03F 7/20
[52] U.S. Cl. .................................. 430/296; 430/327; 430/942; 250/492.2; 250/492.3
[58] Field of Search .................... 430/296, 327, 942; 250/492.2, 492.3

[56] References Cited

U.S. PATENT DOCUMENTS 5,008,553 4/1991 Abe .................................... 430/296

FOREIGN PATENT DOCUMENTS 0475033 3/1992 European Pat. Off. .

OTHER PUBLICATIONS

"Corrections to proximity effects in electron beam lithography, III, Experiments", J. Appl. Phys. 50(6), Jun. 1979, Parikh.
"Proximity effect correction for electron beam lithography by equalization of back-ground dose", J. Appl. Phys. 54(6), Jun. 1983, Owen.
"Measurements of electron range and scattering in high voltage e-beam lithography", J. Vac. Sci. Technol. B3(1), Jan./Feb. 1985, Mankiewich.
"Corrections to proximity effects in electron beam lithography, I. Theory", J. Appl. Phys. 50(6), Jun. 1979, Parikh.
"Representative Figure Method for Proximity Effect Correction", Japanese Journal of Applied Physics, vol. 30, No. 3B, Mar., 1991, pp. L528–L531, Abe.
"Corrections to proximity effects in electron beam lighography, II, Implementation", J. Appl. Phys. 50(6), Jun. 1979, Parikh.
"Proximity effect correction calculations by the integral equation approximate solution method", J. Vac. Sci. Technol. B4(1), Jan./Feb. 1986, Pavkovich.
J. Appl. Phys. vol. 65, No. 4, pp. 1776–1781, Feb. 15, 1989, T. K. Leen, "Theory and Practice of Proximity Correction by Secondary Exposure".
Patent Abstracts of Japan, JP–61–284–921, Dec. 15, 1986.

*Primary Examiner*—Kathleen Duda
*Attorney, Agent, or Firm*—Oblon, Spivak, McClelland, Maier & Neustadt

[57] ABSTRACT

In an electron beam lithographic method including a correction radiation step based on the ghost method, the entire correction region is divided into small regions, each having a size smaller than a spread of backscattering of an electron beam and larger than a minimum figure which can be drawn. Representative figures are set, as radiation unit figures in the respective small regions, to be smaller in number than the number of times of radiation to be performed when the desired patterns in the small regions are drawn as black/white-inverted patterns. Exposure dose are set for the representative figures in the respective small regions. The electron beam is defocused to increase a beam size to a size roughly coinciding with the spread of backscattering, and the representative figures in the respective small regions are drawn with the set exposure dose.

14 Claims, 21 Drawing Sheets

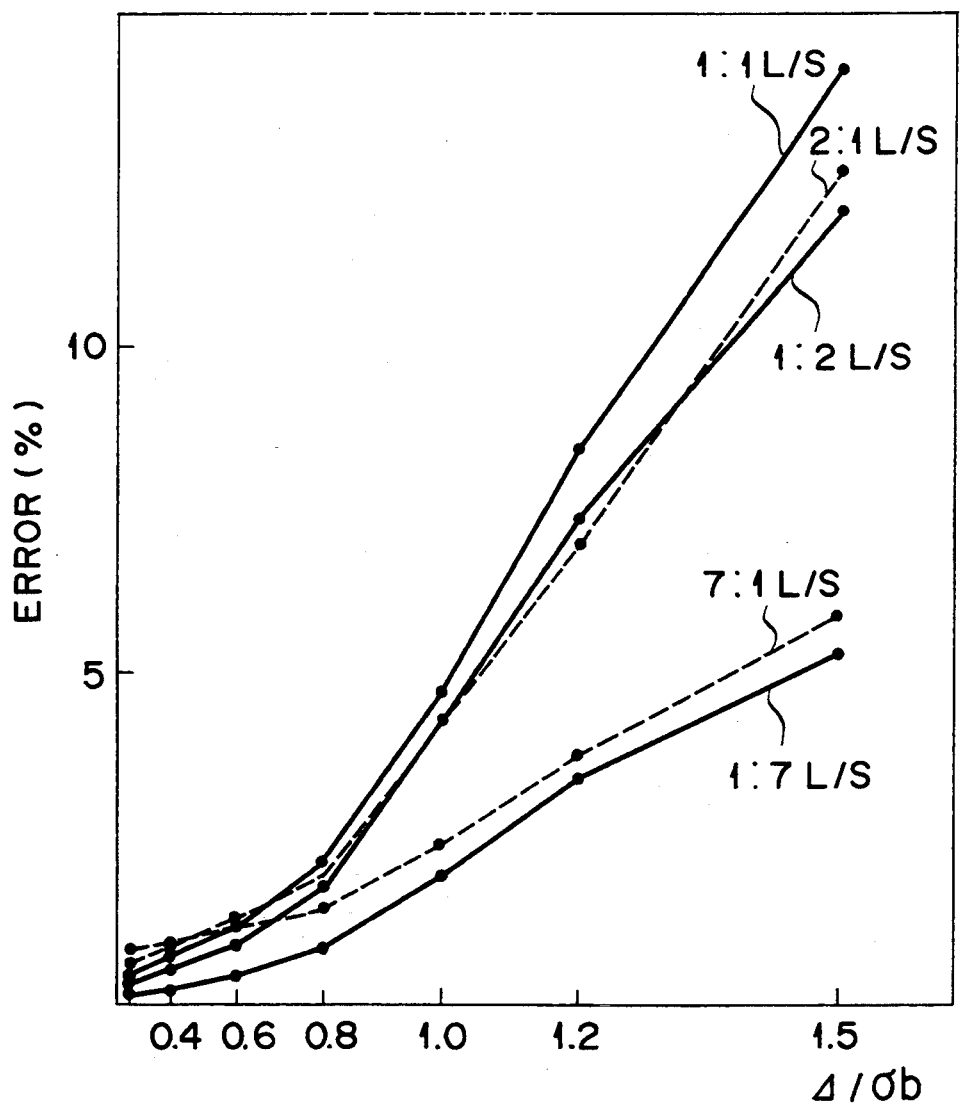
F I G. 1

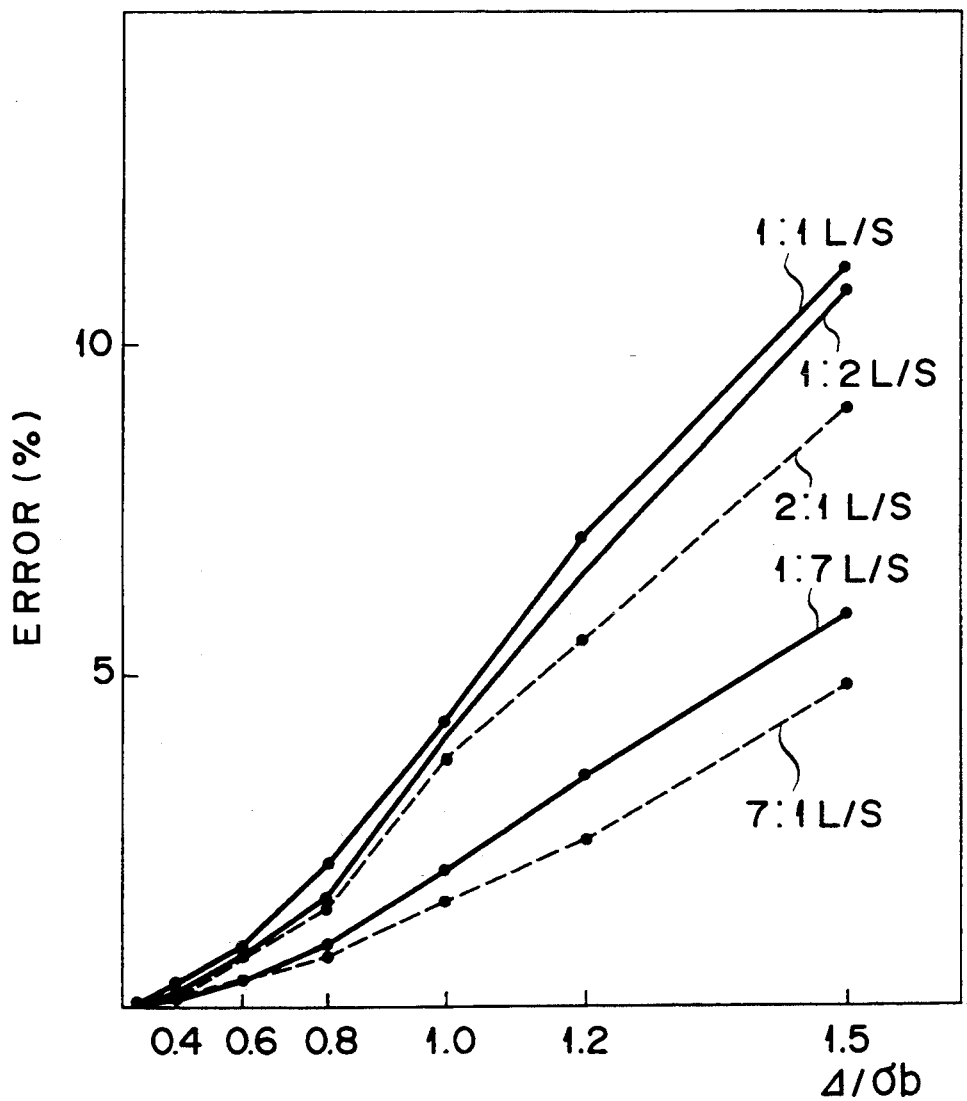
F I G. 3

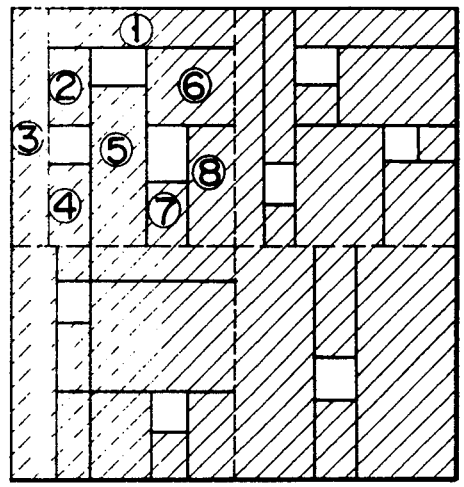
F I G. 6A
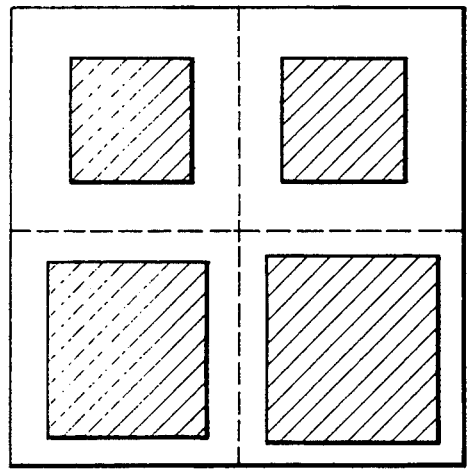
F I G. 6B
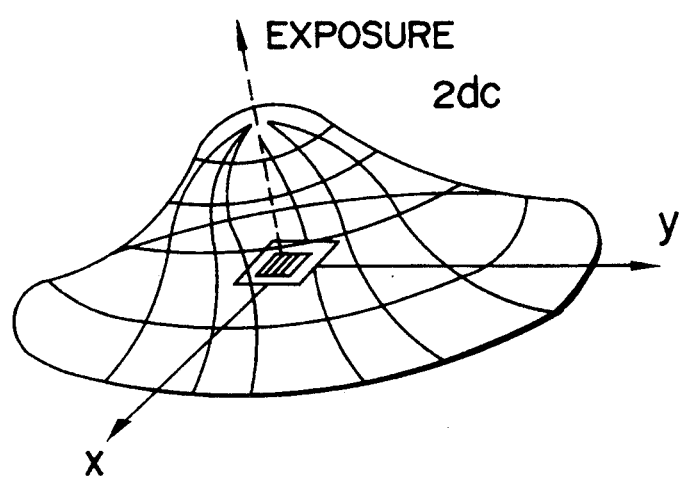
F I G. 6C

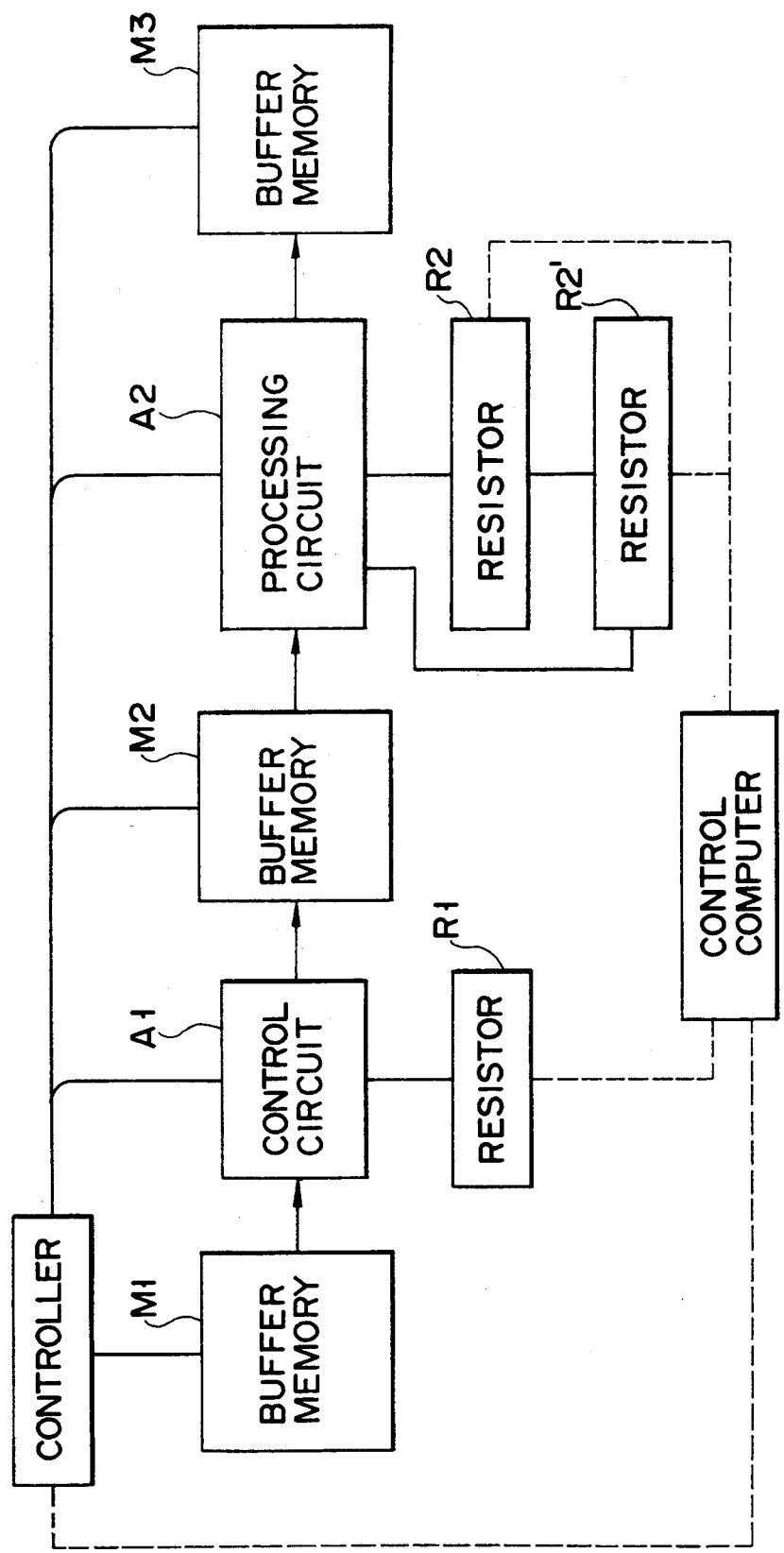
F I G. 7

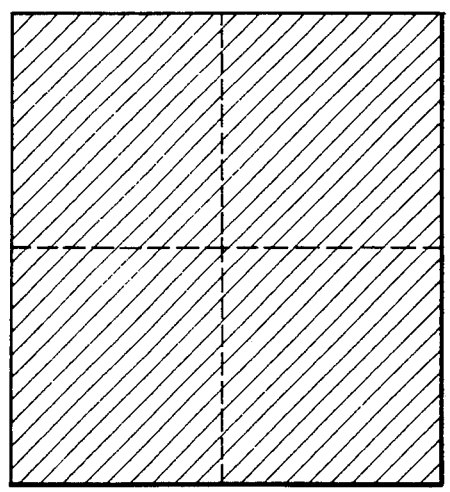
F I G. 8
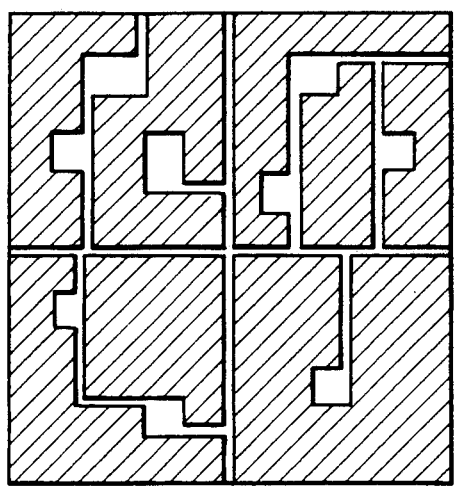
F I G. 9

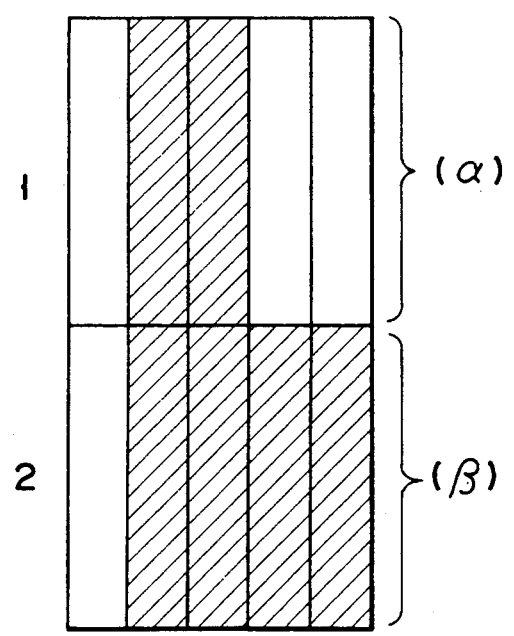
F I G. 11B

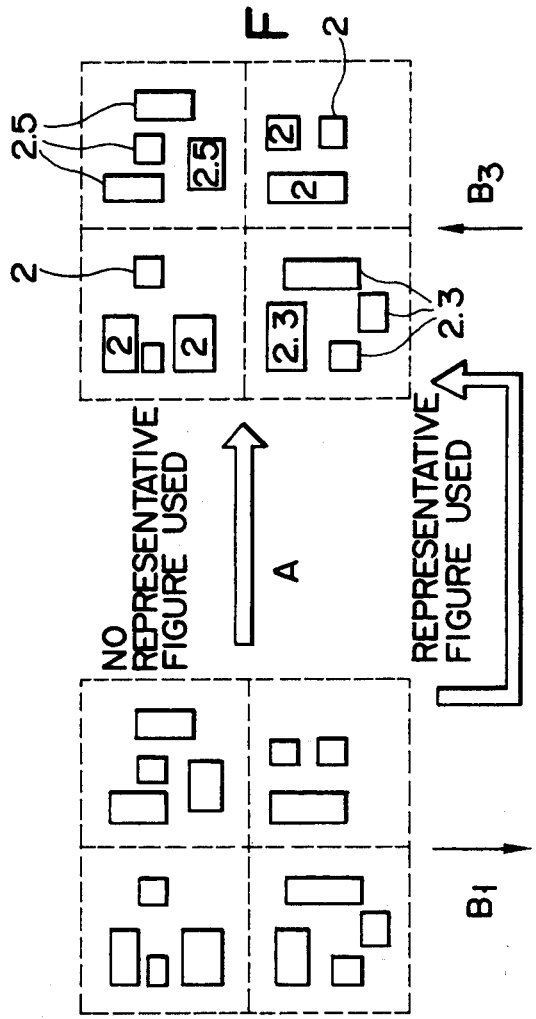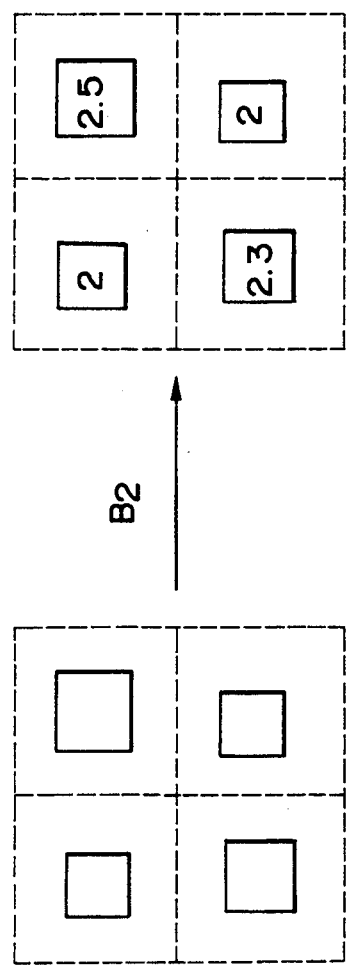
FIG. 13A  FIG. 13B  FIG. 13C  FIG. 13D

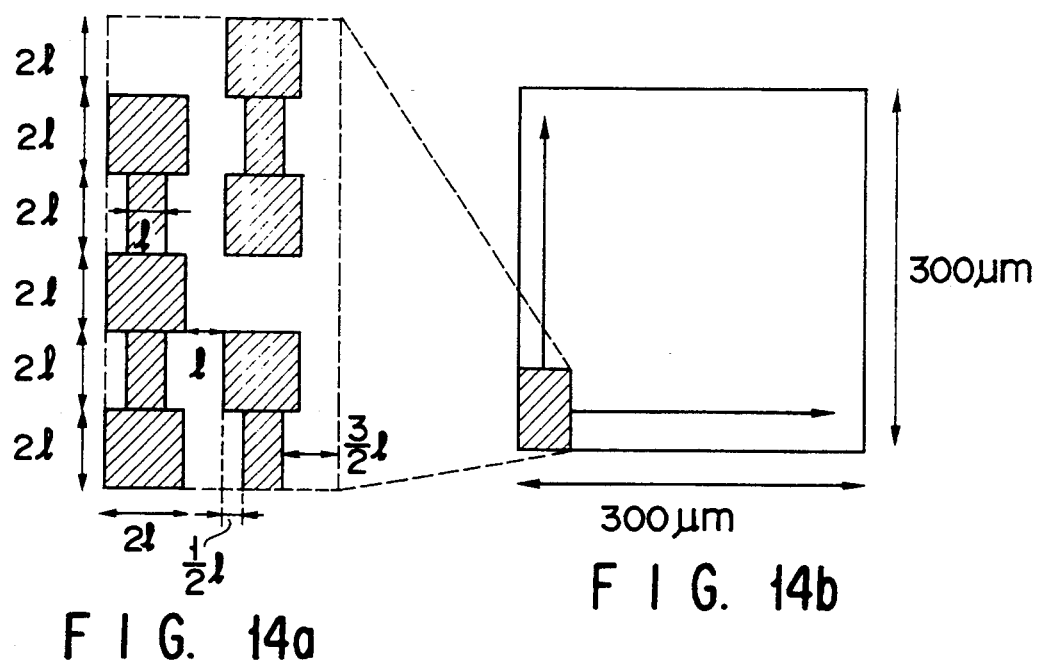
F I G. 14a  F I G. 14b
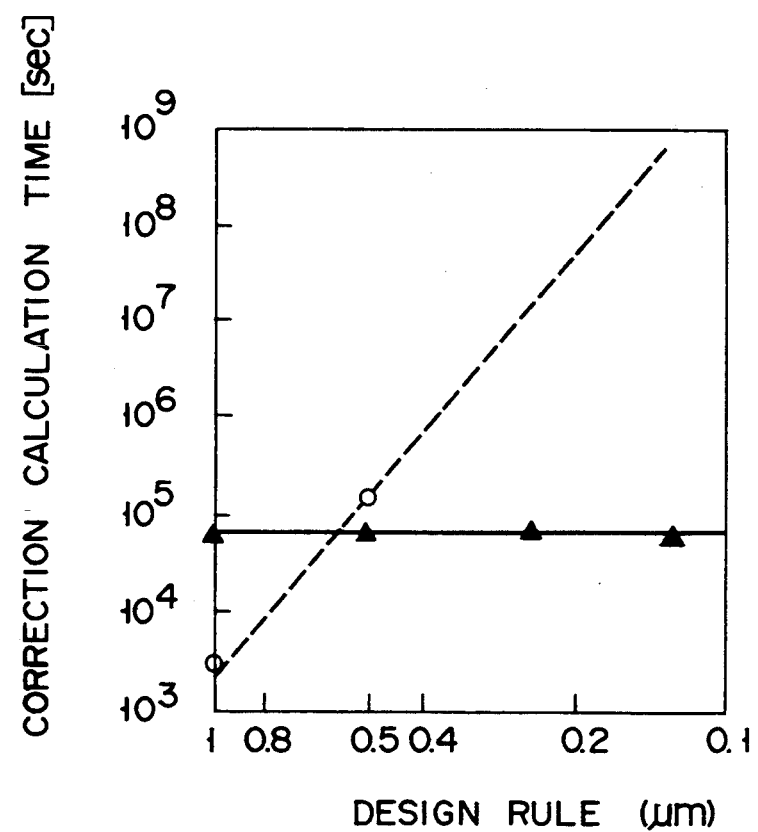
F I G. 15

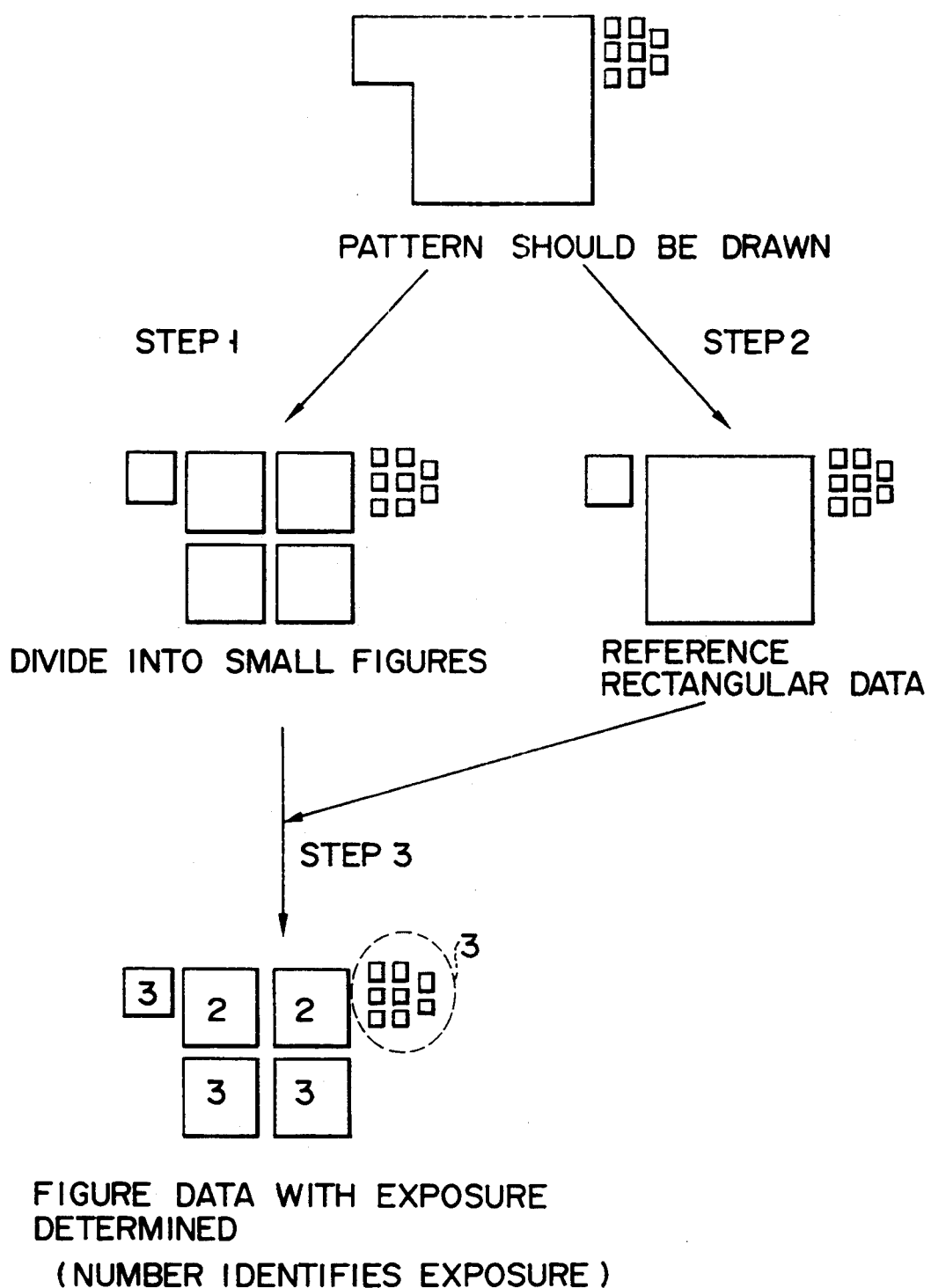
F I G. 16

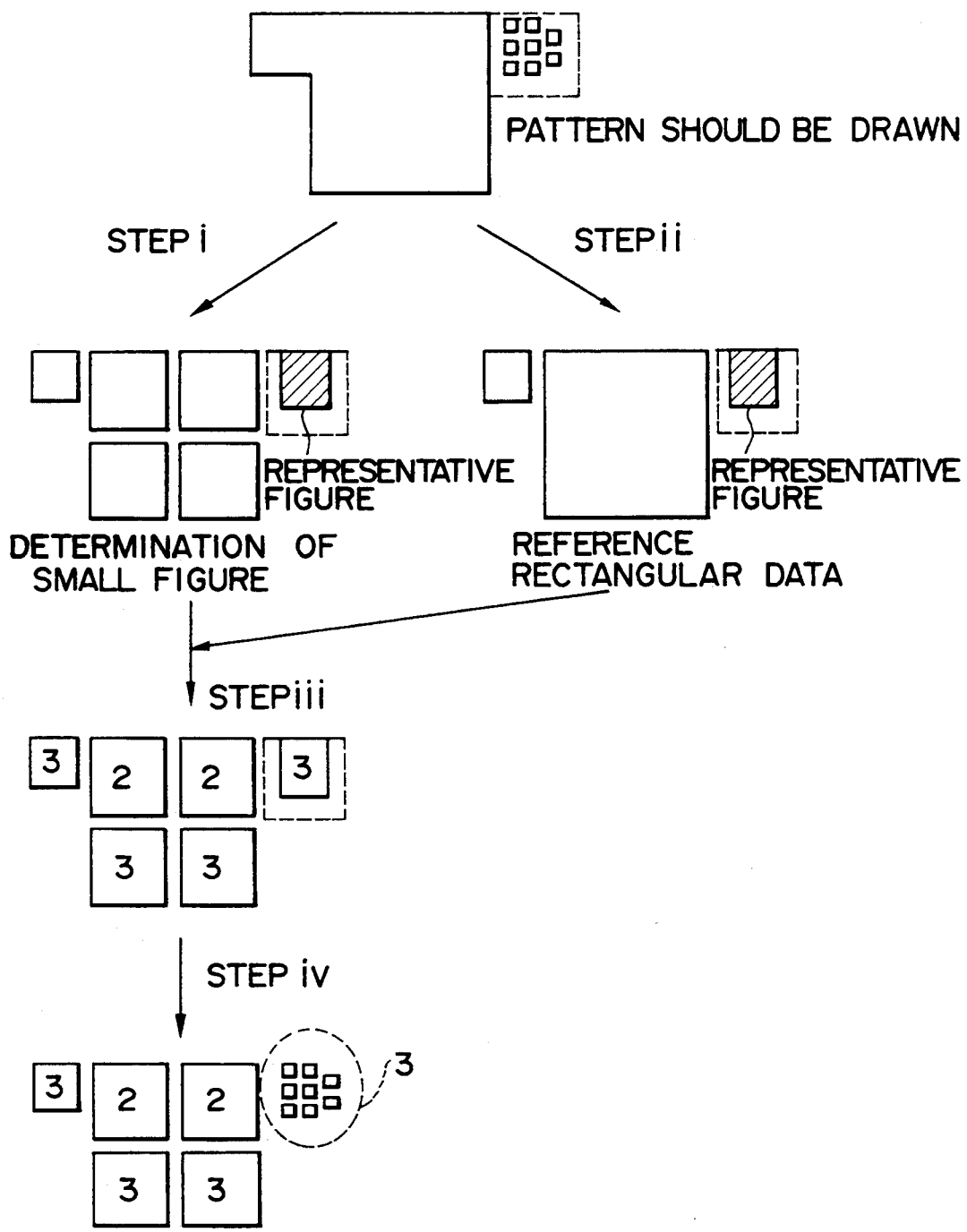
F I G. 18

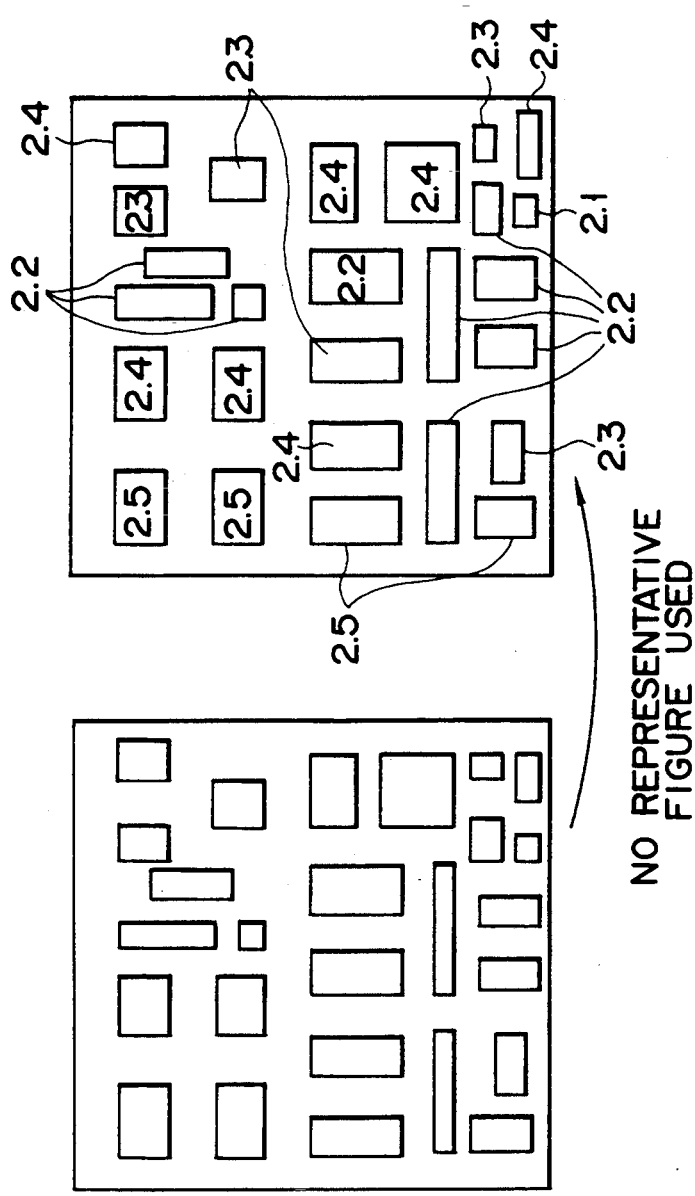

(DATA 1)

DETERMINATION OF REPRESENTATIVE FIGURE (DATA 2)

DETERMINATION OF REPRESENTATIVE POSITION

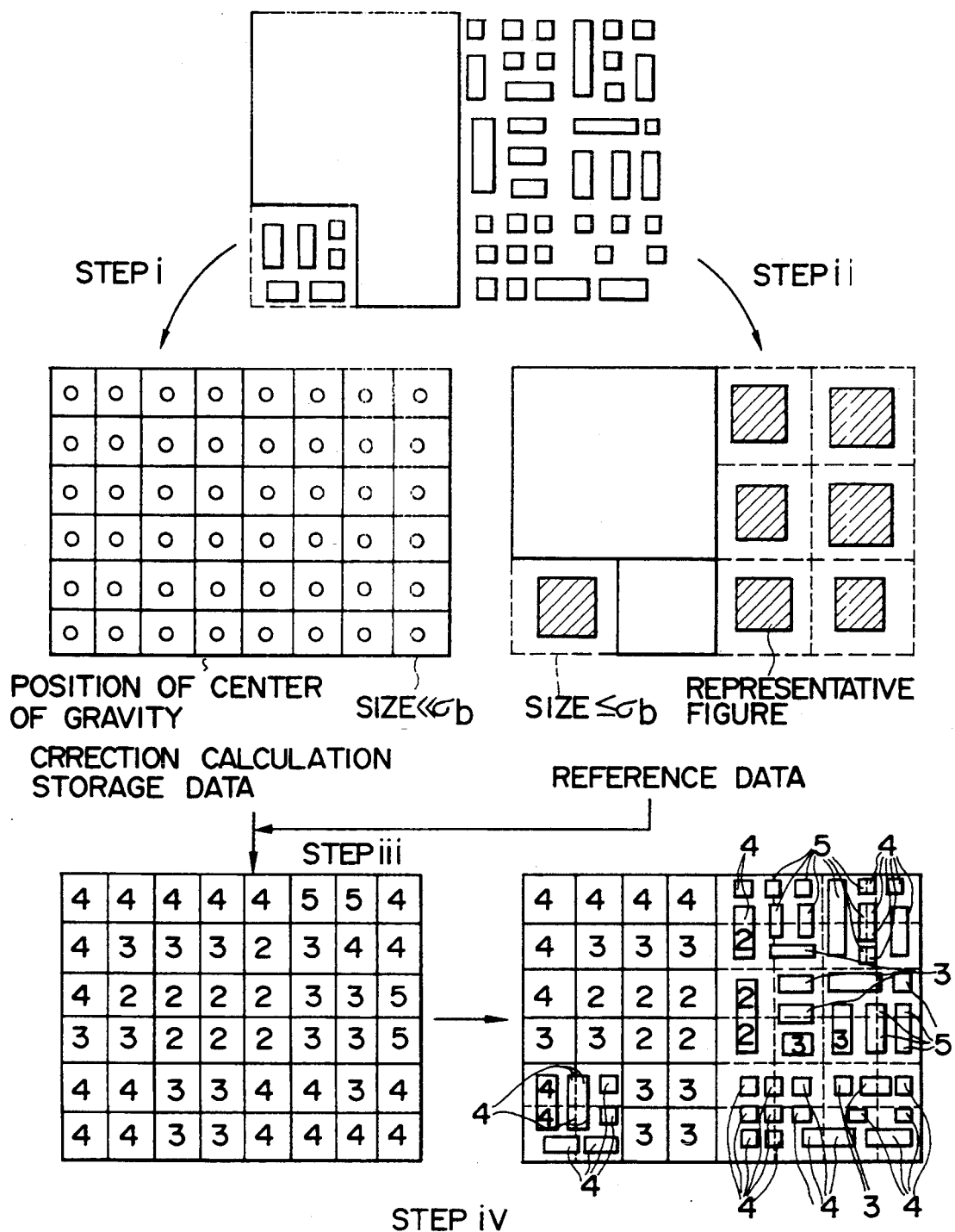
F I G. 21

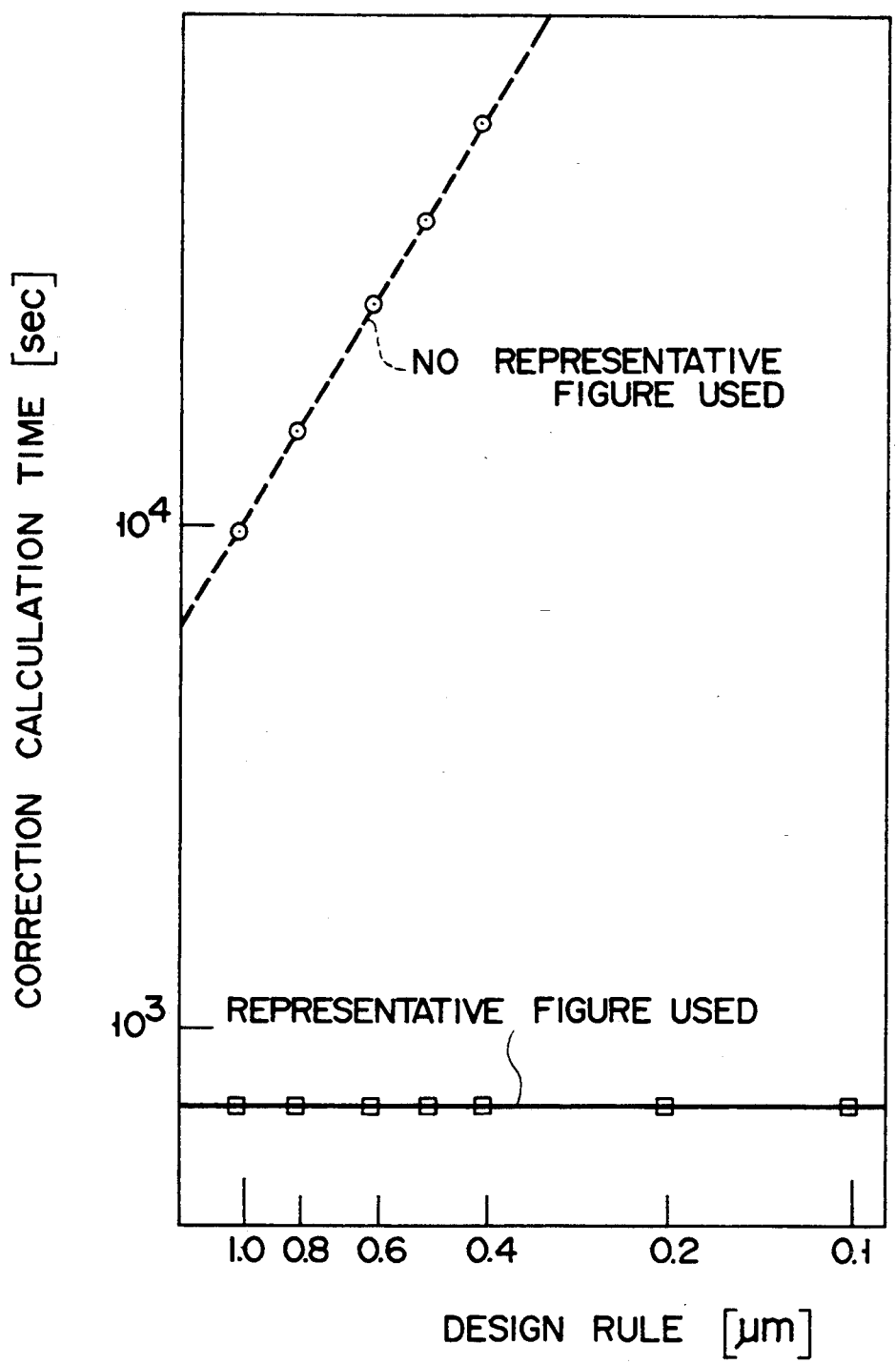
F I G. 23

ELECTRON BEAM LITHOGRAPHIC METHOD AND APPARATUS

This application is a continuation of application Ser. No. 07/760,993, filed on Sep. 17, 1991, now abandoned.

BACKGROUND OF THE INVENTION

1. Field of the Invention

The present invention relates to electron beam lithography and, more particularly, to an electron beam lithographic method and apparatus designed to reduce proximity effects.

2. Description of the Related Art

Recently, an electron beam lithographic apparatus has been used as an apparatus for drawing microscopic patterns on samples such as semiconductor wafers and mask substrates. In the electron beam lithographic apparatus, however, the influences of the proximity effect, i.e., thickening and thinning of patterns due to backscattered electrons pose problems. A ghost method and an exposure correction method, which have recently attracted a great deal of attention as methods of correcting the proximity effects, will be described below.

In the ghost method as the first method of correcting the proximity effects (Reference: Published Unexamined Japanese Patent Application No. 59-921 and G. Owen and P. Rissman, "*Proximity effect correction for electron beam lithography by equalization of background dose*", J. Appl. Phys. Vol. 54, No. 6 (1983), pp. 3573–3581), patterns are drawn by using a correctly focused electron beam at an incident electron current density Qp (to be referred to as "pattern drawing" hereinafter). Thereafter, the beam is defocused to have a diameter dc, and the inverted patterns are irradiated with the beam at an incident electron current density Qc (to be referred to as "correction radiation" hereinafter). A beam diameter dc and the incident electron current density Qc in a defocus state are set to satisfy equations (1) to (3):

$$dc = 2\sigma_c \ldots \quad (1)$$

$$\sigma_c = \sigma_b/(1+\eta_E)^{\frac{1}{2}} \ldots \quad (2)$$

$$Qc = Qp \times \eta_E/(1+\eta_E) \ldots \quad (3)$$

where $\sigma_b$ is the radius at which the intensity of backscattered electrons becomes 1/e, $\sigma_c$ is the radius at which the intensity of the defocused beam on a sample surface becomes 1/e, and $\eta_E$ is the backscattering energy coefficient of an underlying material for patterning. For example, the values of $\sigma_b$ and $\eta_E$ are set to be $\sigma_b = 10$ μm and $\eta_E 0.7$ at an accelerating voltage of 50 kV; and $\sigma_b = 2.0$ μm and $\eta_E 0.78$, at an accelerating voltage of 20 kV (Reference: P. M. Mankiewich et al., "*Measurement of electron range scattering in high voltage e-beam lithography*", J. vac. Sci. Technol. B, Vol. 3, No. 1, Jan/Feb 1985, pp. 174–176).

The above-mentioned method, however, has the following problems. In general, when an LSI having a small number of patterns is to be subjected to correction radiation, the number of regions to be subjected to correction drawing is increased, and the number of figures for correction drawing is increased. For this reason, a vector scan type lithographic apparatus or a lithographic apparatus using a variable-shaped beam requires a longer period of time for correction radiation than for pattern drawing. In addition, it takes much time to perform data conversion for forming inverted patterns.

As the second method of correcting the proximity effects, an exposure correction method is known. In this method, the exposure dose of each radiation region is adjusted in accordance with the size and density of a corresponding pattern. In the conventional radiation correction method, an exposure dose is determined by a method using a matrix (Reference: M. Parikh, "*Corrections to proximity effects in electron beam lithography*", J. App. Phys., Vol. 50, No. 6, Jun. 1979, pp. 4371–4387). According to the above-mentioned matrix method, an optimal exposure dose at each position is obtained by, e.g., obtaining the inverse matrix of a matrix representing the relationship between the exposure dose and the absorbed energy amount in resist at each position.

In the exposure correction method, however, the calculation time for determining an optimal exposure dose is prolonged with an increase in resolution and density of patterns. In the case of the matrix method, since the calculation time is prolonged by the third power of the density of patterns, it becomes practically impossible to determine an optimal exposure dose with an increase in resolution of patterns.

As described above, in the conventional electron beam lithographic method, when the proximity effects are to be corrected by the ghost method, the time required for correction radiation is prolonged, leading to, e.g., a decrease in throughput.

when the proximity effects are to be reduced by the exposure dose correction method, the time required to determine an exposure dose is prolonged with an increase in density of patterns. As a result, it becomes practically impossible to apply the method to an LSI having a large number of patterns.

SUMMARY OF THE INVENTION

It is an object of the present invention to provide an electron beam lithographic method and apparatus which can shorten the time required for correction radiation in the ghost method and can increase the throughput.

It is another object of the present invention to provide an electron beam lithographic method which can prevent a deterioration in pattern dimension precision due to the proximity effects by performing exposure dose correction, and in which the time required for determination of an exposure dose is not dependent on the density of patterns.

The gist of the present invention lies in that an entire lithographic region is divided into small regions (2A) when correction radiation is to be performed, and representative figures are set in units of small regions to decrease the number of shots in correction radiation and to shorten the time for correction radiation.

According to the first aspect of the present invention, there is provided an electron beam lithographic method characterized by;

an electron beam lithographic method including the step of drawing desired patterns on a sample by radiating an electron beam thereon, and the step of correcting an electron beam on the sample before or after the step of drawing the desired patterns to reduce proximity effects due to backscattering accompanying pattern drawing, the step of correcting the beam comprising the steps of:

dividing an entire correction region into small regions, each having a size smaller than a spread of backscattering of an electron beam and larger than a minimum figure which can be drawn;

selecting representative figures, as radiation unit figures in the respective small regions, smaller in number than the number of times of radiation to be performed when the desired patterns in the small regions are drawn as black/white-inverted patterns;

setting exposure dose for the representative figures in the respective small regions; and defocusing the electron beam to increase a beam size to a size roughly coinciding with the spread of backscattering, and drawing the representative figures in the respective small regions with the set exposure dose.

According to the second aspect of the present invention, there is provided an electron beam lithographic apparatus characterized by;

an electron beam lithographic apparatus for drawing desired patterns on a sample by radiating an electron beam thereon, and performing correction radiation of an electron beam on the sample to reduce proximity effects due to backscattering accompanying pattern drawing, comprising:

means for dividing an entire correction region of the sample into small regions, each having a size smaller than a spread of backscattering of an electron beam and larger than a minimum figure which can be drawn;

means for setting representative figures, as radiation unit figures in the respective small regions, smaller in number than the number of times of radiation to be performed when the desired patterns in the small regions are drawn as black/white-inverted patterns;

means for setting exposure dose for said representative figures in the respective small regions; and means for defocusing the electron beam to increase a beam size to a size roughly coinciding with the spread of backscattering, and drawing the representative figures in the respective small regions with the set exposure dose.

According to the third aspect of the present invention, there is provided an electron beam lithographic method characterized by;

an electron beam lithographic method, in which before desired patterns are drawn on a sample by radiating an electron beam thereon, optimal exposure dose is obtained in units of positions in the respective patterns to be drawn, and the respective patterns are drawn with the optimal exposure dose, comprising the steps of:

dividing a lithographic region into small regions, each having a size smaller than a spread of backscattering of an electron beam and larger than a minimum figure which can be drawn;

setting a representative figure representing patterns to be drawn in at least one of the small regions;

assuming that each representative figure is drawn in each of the small regions, determining optimal exposure dose for the respective representative figures; and determining the optimal exposure dose determined with respect to the representative figures in the respective small regions as optimal exposure dose for the patterns to be drawn which are included in the respective small regions.

According to the fourth aspect of the present invention, there is provided an electron beam lithographic method characterized by;

an electron beam lithgraphic method including the step of drawing desired patterns on a sample by radiating an electron beam thereon, and the step of performing correction radiation of an electron beam on the sample before or after the step of drawing the desired patterns to reduce proximity effects due to backscattering accompanying pattern drawing, the step of performing correction radiation comprising the steps of:

dividing an entire correction region into small regions, each having one of the size of substantially equivalent and less than a full width half maximum of a distribution of a spread of backscattering of an electron beam;

setting by representative figures, as radiation unit figures in the respective small regions, smaller in number than the number of times of radiation to be performed when the desired patterns in the small regions are drawn as black/white-inverted patterns;

setting exposure dose for the representative figures in the respective small regions; and defocusing the electron beam to increase a beam size to a size roughly coinciding with the spread of backscattering, and drawing the representative figures in the respective small regions with the set exposure dose.

According to the fifth aspect of the present invention, there is provided an electron beam lithographic method characterized by;

an electron beam lithographic method, in which before desired patterns are drawn on a sample by radiating an electron beam thereon, optimal exposure dose are obtained in units of positions in the respective patterns to be drawn, and the respective patterns are drawn with the optimal exposure dose, comprising:

the first step of dividing a lithographic region into small regions, each having a size sufficiently smaller than a spread of backscattering of an electron beam, and setting representative positions at the centers of the respective small regions or the centers of gravity of figures included in the respective small regions;

the second step of dividing an entire region of a first pattern or a second pattern to be drawn, the second pattern being obtained by inverting the first pattern into regions, each having the one of the sizes of equivalent and less than the full width half maximum of the spread of backscattering of an electron beam, independently of the division of the lithographic region, and setting a representative figure representing the pattern in at least one of the regions;

the third step of determining optimal exposure dose for the patterns included in the respective small regions formed in the first step at the respective representative positions by using the representative figure formed in the second step, if the representative figure is assumed to be drawn; and the fourth step of determining the optimal exposure dose determined in the third step with respect to the representative positions of the respective small regions formed in the first step as optimal exposure dose for the patterns to be drawn which are included in the respective said each small regions formed in the second step.

According to the first and second aspects of the present invention, when correction radiation is to be performed, an entire lithographic region is divided into small regions $2\Delta$, and representative figures are set in units of small regions. With this operation, a large number of figures included in each small region $2\Delta$ are represented by one or few representative figures, thus decreasing the number of shots in correction radiation. As will be described later, in the first and second aspects of the present invention, the proximity effects can be corrected in substantially the same manner as in the conventional methods. Therefore, the correction radiation time can be shortened, and the throughput can be increased.

In addition, according to the first and second aspects of the present invention, a large number of figures in each small region can be substituted by a small number of representative figures.

Effects obtained by applying the present invention to the ghost method and the exposure correction method will be described below.

The case wherein the present invention is applied to the ghost method will be described first. In the first and second aspects of the present invention, correction drawing patterns can be substituted by representative figures. As a result, the number of shots in correction radiation can be reduced, and the correction radiation time can be greatly shortened.

For example, a case wherein correction radiation of $10 \times 10$ patterns of a 256 mega bit DRAM is performed will be considered below.

Assume that a variable-shaped beam scheme lithographic apparatus with an accelerating voltage of 50 kV is used, and that the size of one chip is 10 mm × 10 mm and the number of shots per bit (the number of rectangular inverted patterns) is five.

In the conventional method, rectangular exposure of $$5 \times 256 \times 10^6 \times 100 = 1.3 \times 10^{11}$$

must be performed. If the shot cycle is 200 nsec, the time required for correction radiation is $$1.3 \times 10^{11} \times 200 \times 10^{-9} = 2.6 \times 10^4 \text{ sec}$$

In contrast to this, according to the first and second aspects of the present invention, the correction radiation time is set as follows.

When an accelerating voltage of 50 kV is set, since $\sigma_b \approx 10$ μm and $3\sigma_b \approx 30$ μm, "2 μm × 2 μm" is sufficient for the size of a small region. If the maximum possible beam size of the apparatus is 2 μm or more, only one unit figure (a rectangular shot in this case) need be set in the small region, and the number of shots is $$(100 \times 100)/(2 \times 10^{-3} \times 2 \times 10^{-3}) = 2.5 \times 10^9$$

Therefore, the time required for correction radiation is $$2.5 \times 10^9 \times 200 \times 10^{-9} = 500 \text{ sec}$$

That is, the correction radiation time can be reduced to about 1/50 that required in the conventional method.

The effect obtained by applying the present invention to the exposure dose correction method will be described next.

According to the third aspect of the present invention, the exposure dose of representative figures set in units of small regions are calculated, and the calculation results correspond to the original LSI patterns. For this reason, the optimal exposure dose of the original patterns need not be directly calculated, thus greatly shortening the time required to calculate optimal exposure dose. In addition, as will be described in detail later, the size of a small region itself depends on only an accelerating voltage and the type of a substrate but does not depend on the characteristics (e.g., pattern density) of a pattern to be drawn. For example, if the accelerating voltage is set to be 50 kv and an Si substrate is used, "2 μm × 2 μm" is sufficient for the size of a small region.

More specifically, in "the step of calculating an optimal exposure dose" which requires the maximum calculation time, the calculation time for an optimal exposure dose is completely independent of the pattern density of an LSI regardless of its packing density, but is determined by only the pattern density of representative figures $(1/(2 \text{ μm} \times 2 \text{ μm}))$ in the above case).

In an LSI such as a 256 mega bit DRAM, about five figures are present in the 2 μm × 2 μm region. If the original figures are to be used without any modifications as in the conventional method, the five figures are used. In the third aspect of the present invention, however, correction of only one figure is required. According to the third aspect of the present invention, therefore, the correction calculation time can be shortened to 1/5 to $1/5^2$.

The reasons why "the influences of the proximity effects scarcely change even if patterns in a small region are replaced by a representative figure" in the first, second and third aspects will be described below.

The reasons why representative figures can be used in the exposure dose correction method will be described first.

Assume that double Gaussian approximation (Reference: T. Abe et al., "Representative Figure Method for Proximity Effect Correction", J. J. of Applied Physics, vol. 30, No. 3B, March 1991, pp. 528–531) is employed, and that spread of forward scattering is zero.

A given point x (hereafter, underlined character represents a vector) to be irradiated is moved to the coordinate origin by redefining its coordinates. The entire region is divided into small regions, each having a size of $2\Delta \times 2\Delta$ smaller than a spread $\sigma_b$ of backward scattering. The absorbed energy amount in a resist at the coordinate origin (0,0) to be irradiated is represented by $$E(0,0) = 1 + (\eta_E/\pi\sigma_b^2) \cdot \sum_j \int \exp[-(\underline{R_j} - \underline{x_f})^2/\sigma_b^2] d\underline{x_f} \quad (4)$$

The first term represents a contribution based on forward scattering; and the second term, a contribution based on backward scattering. Sum Σ is calculated in all the small regions. Vector $R_j$ represents the center (not the center of gravity of a figure) position of a small region j which is calculated in the redefined coordinate system. Integration is performed only for pattern portions present in each small region.

An integrand F(x) is represented by $$F(\underline{x}) = \exp[-(\underline{R}_j - \underline{x}_j')^2/\sigma_b^2]\ldots \quad (5)$$

If this integrand is subjected to Taylor expansion for $x_j'/\sigma_b$, we have:

$$F(\underline{x}) = \exp(-\underline{R}_j^2/\sigma_b^2) + \\ \exp(-\underline{R}_j^2/\sigma_b^2) \cdot (2(\underline{R}_j \cdot \underline{x}_j')/\sigma_b^2) + \\ \exp(-\underline{R}_j^2/\sigma_b^2) \cdot \left[ \frac{x_j'^2}{\sigma_b^2} + \frac{2(\underline{R}_j \cdot \underline{x}_j')^2}{\sigma_b^4} \right] \quad (6)$$

A substitution of equation (6) into equation (4) yields:

$$E(0,0) = 1 + (\eta_E/\pi\ \sigma_b^2) \times \\ \Big[ \sum_j \{\exp(-R_j^2/\sigma_b^2)(\int dx_j'/\sigma_b^2)\} +$$

(order of $(\Delta/\sigma_b)^0$)

$$\sum_j \{\exp(-R_j^2/\sigma_b^2)(\int (R_j \cdot x_j')dx_j'/\sigma_b^4)\} +$$

(order of $(\Delta/\sigma_b)^1$)

$$Er +$$

(order of $(\Delta/\sigma_b)^2$)

$$O(\Delta^3/\sigma_b^3)\Big] \quad (7)$$

for $$Er = (\eta_E/\pi) \times \\ \sum_j [\{\exp(-\underline{R}_j^2/\sigma_b^2)(\int [\underline{R}_j \cdot \underline{x}_j')^2/\sigma_b^4 - \\ \underline{x}_j'^2/\sigma_b^2]d\underline{x}_j'/\sigma_b^2\}] \quad (8)$$

(order of $(\Delta/\sigma_b)^2$)

As described on the right sides of equations (7) and (8), equations (7) and (8) are expanded for $(\Delta/\sigma_b)$.

The expansion of equation (7) converges if $|R_j|.\Delta/\sigma_b^2 < 1$. The convergence condition is satisfied by the following conditions:

1) The value of $\Delta$ is set to be close to $\sigma_b/10$.
2) The absorbed energy amount of a resist is evaluated in a range roughly satisfying $|R_j| < 3\sigma_b$.

According to the above conditions, since $|R_j|.\Delta/\sigma_b^2 = (3\sigma_b).(\sigma_b/10) \approx 3/10 < 1$, equation (7) converges.

Assume that expansion of equations (7) and (8) is performed with respect to an original LSI pattern and a representative figure pattern. Assuming that the term of the order of $(\Delta/\sigma_b)^0$ for the original pattern is equal to that for the representative figure pattern, $$\int dx_j'(\text{original pattern small regions}) = \quad (9)$$
$$\int \underline{dx}_j'(\text{representative figure small regions})$$

Equation (9) represents a condition "the area of an original pattern and that of a representative figure are set to be equal to each other in units of small regions".

If the same operation is performed with respect to the term of the order of $(\Delta/\sigma_b)^1$.

$$\int x_j' \underline{dx}_j'(\text{original pattern small region}) = \quad (10)$$
$$\int \underline{x}_j' \underline{dx}_j'(\text{representative figure small region})$$

Equation (10) represents a condition "the center of gravity of an original pattern and that of a representative figure are set to coincide with each other in units of small regions".

It is apparent from the above description that "if the areas and the centers of gravity of an original pattern and a representative figure are set to coincide with each other in units of small regions, the terms of $(\Delta/\sigma_b)^0$ and $(\Delta/\sigma_b)^1$ coincide with each other, and an error due to substitution is of the order of $(\Delta/\sigma_b)^2$".

A reference value with respect to an error due to substitution is given by Er of equation (8).

The above-mentioned error will be estimated below. Assuming that "if a figure is present in any portion of a small region, the figure is present throughout the small region", equation (11) can be obtained by executing the integration of equation (7) as follows:

$$Er = (2\eta_E/3\pi)(\Delta^2/\sigma_b^2) \times \\ \sum_j (2\Delta/\sigma_b)(2\Delta/\sigma_b(\exp(-\underline{R}_j^2/\sigma_b^2) \times \\ [\{(R_{jx}^2/\sigma_b^2) + (R_{jy}^2/\sigma_b^2)\} - 1] \quad (11)$$

for $R_j = (R_{jx}, R_{jy})$. If $2\Delta/\sigma_b$ in equation (11) is set to be a sufficiently small value, and $2\Delta/\sigma_b$ (first appearance), $2\Delta/\sigma_b$ (second appearance), $R_{jx}/\sigma_b$, and $R_{jy}/\sigma_b$ are respectively substituted by dx, dy, x, and y to substitute the sum expression in equation (11) by an integration expression, the following expression is obtained:

$$Er \approx (2\eta_E/3\pi)\Delta^2/\sigma_b^2) \times \int dxdy\{(x^2+y^2-1)\cdot\exp(-(x^2+y^2))\}\ldots \quad (12)$$

The order of an error caused by the substitution of equation (12) for equation (11) is $\Delta^3/\sigma_b^3$ and hence is negligible.

$$E \approx A \times (2\eta_E/390) \\ A = (2\eta_E E/3\pi) \times \int dxdy\{x^2+y^2-1)\cdot\exp(-(x^2+y^2))\}\ldots \quad (13)$$

then, the maximum value of A is obtained as follows.

Equation (13) is substituted by polar coordinates to obtain;

$$A = (2\eta_E/3\pi) \times \int rdrd\theta[(r^2-1)\cdot\exp(-r^2)]\ldots \quad (14)$$

As a result, it is apparent that
1) an integral region in which the maximum value of A is obtained is defined as $r \geq 1$, and
2) an integral region in which the minimum value of A is obtained is defined as $0 \leq r \leq 1$.

The integration of equation (14) is executed to obtain $$A_{max} = +(\tfrac{2}{3})\cdot\eta_E\cdot\exp(-1)\ A_{min} = -(\tfrac{2}{3})\cdot\eta_E\cdot\exp(-1)\ldots \quad (15)$$

From the above description, an error due to the substitution of a representative figure for original figures is $$\pm(\tfrac{2}{3})\cdot\eta_E\cdot\exp)-1)\cdot\Delta^2/\sigma_b^2 \ldots \quad (16)$$

and is negligible. An error which is caused when proximity effect correction (the ghost method and the exposure dose correction method) is performed by using representative figures can be obtained from equation (16).

It is guaranteed from the above description that representative figures can be used in the exposure dose correction method.

The reason why representative figures can be used in the ghost method can be explained as follows.

If the area and center of gravity of a patterning pattern in a given small region are respectively represented by $S_p$ and $x_p$; and those of a correction radiation pattern, $S_c$ and $x_c$, then, the above values have the following relationships:

$$x_p S_p + x_c S_c = 0 \quad S_p + S_c = 2\Delta \times 2\Delta \ldots \quad (17)$$

The patterning pattern can be freely changed within the range in which its center of gravity and area coincide with those of an original pattern. With changes in the patterning pattern, the correction radiation pattern can be freely changed. However, changes in the correction radiation pattern are limited by the condition represented by equation (17). That is, "the correction radiation pattern can be changed within the range in which its center of gravity and area coincide with those of an (white-black) inverted pattern". An error due to the use of representative figures can be obtained from equation (16). If, for example, an accelerating voltage of 50 kV is set, $\sigma_b \approx 10$ μm. Assuming that $\Delta = 1$ μm (the size of a small region is 2 μm), an error due to the use of representative figures is as small as $(\frac{2}{3}) \times 0.7 \times \exp(-1) \times (1/10)^2 \approx 0.0024 \approx$ about 0.24%.

As described above, an error due to correction by means of representative figures is very small.

These are:
1) the reason why patterns can be substituted by representative figures in the exposure dose correction method, and
2) the reason why correction lithographic patterns can be substituted by representative figures in the ghost method.

Representative figures can be very easily set. This is because in setting the representative figures, there is no need to consider a large number of figure correlations within the range of $3\sigma_b$ as in exposure dose correction, but the representative figures are determined by only figures in small regions.

When the present invention is applied to the ghost method, correction exposure pattern can also be modified in the following manner.

Assume that n representative figures are set, as a correction lithographic pattern, in a small region, and that the area and center of gravity of one representative figure $A_i$ are respectively represented by $S_j$ and $x_j$.

In this case, the area of the representative figure $A_i$ is divided to (1/t), and t new figures obtained by the division are perfectly superposed on each other. That is, assume that the center of gravity of the t new figures coincides with that of the original figure. Even with the above-described modification, the condition that the centers of gravity and areas coincide with each other is kept satisfied, and hence the above modification is allowed. The modification corresponds that the area of the representative figure $A_i$ is set to be 1/t, and the correction exposure dose with respect to the representative figure $A_i$ is increased t times.

The above modification can be performed with respect to all the n representative figures. That is, in consideration of the degree of freedom in setting of original representative figures, it is apparent that the exposure dose and area of each representative figure can be changed in the range in which the following condition is satisfied:

$$Q_c \cdot S_c = \sum_j (Q_j \cdot S_j)$$

where $Q_c$ is the correction exposure dose in the ghost method, $S_j$ is the area of a j-th representative figure set in the small region, and $Q_j$ is the correction exposure dose for the j-th representative figure.

In order to minimize the correction radiation time, a representative figure count N, i.e., a shot count, may be minimized. That is, it is only required to assume a state wherein a maximum beam size Smax and a maximum exposure dose Dmax which the electron beam lithographic apparatus can set can be optimally used. Therefore, the representative figure count N may be set to be the minimum natural number equal to or larger than $$\left( \sum_i (S_i) \times Q_c \right) / (B_{max} \times Q_{max}).$$

In the above description, it is assumed that the size of the small region is sufficiently smaller than the spread $\sigma_b$ of backscattering. In practice, however, the region size can be set to be substantially equal to the spread $\sigma_b$ of backscattering.

The reason for this will be described later. Effects obtained by applying the above method to the ghost method and the exposure correction method will be described below.

The case of the ghost method will be described first.

According to the fourth aspect of the present invention, in correction drawing, the entire lithographic region is divided into regions, each having a size equal to or smaller than the spread of an electron beam. Thereafter, one or more representative figures are set for each divided region to represent a large number of figures therein with the setting of the representative figures, the number of shots in correction drawing can be decreased. In the fourth aspect, similar to the conventional method, proximity effect correction can be performed, as will be described later. Therefore, the correction radiation time can be shortened, and the throughput can be improved.

Similar to the above-described case, the correction radiation time can be shortened by setting the representative figure count N to be the minimum natural number equal to or larger than $$\left( \sum_i (S_i) \times Q_c \right) / (B_{max} \times Q_{max}).$$

In setting the representative figures, there is no need to consider a large number of figure correlations within the range of $3\sigma_b$, but the representative figures are determined by only figures in small regions. Therefore, such a setting operation can be very easily performed.

As described above, according to the fourth aspect of the present invention, it is possible to be extended region sizes substantially larger than full width half maximum (about $2\sigma_b$). According to this aspect, in the ghost method, a large number of figures in small regions can be substituted by a small number of representative figures (shots), thus decreasing the number of shots in correction radiation. Therefore, the correction radiation time can be greatly shortened. For example, a case wherein 10×10 patterns of LSI of a 256 mega bit DRAM class are subjected to correction radiation will be considered below.

Assume that a variable-shaped beam scheme lithographic apparatus with an accelerating voltage of 50 kV is used, and that the size of one chip is 10 mm×10 mm and the number of rectangular shots (inverted patterns) per bit is five. In the conventional method, rectangular exposure dose of $$5 \times 256 \times 10^6 100 = 1.3 \times 10^{11}$$

must be performed. If the shot cycle is 200 nsec, the time required for correction radiation is $$1.3 \times 10^{11} 200 \times 10^{-9} = 2.6 \times 10^4 \text{ sec}$$

In contrast to this, according to the fourth aspect of the present invention, the correction radiation time is set as follows. When an accelerating voltage of 50 kV is set, since $\sigma_b \approx 10$ μm and $3\sigma_b \approx 30$ μm, the region size is set to be, e.g., 1) 10 μm×10 μm equal to the spread of the backscattering ($\sigma_b = 10$ μm) as that size is set equal to or smaller than full width half maximum of distribution of the spread of the backscattering, or 2) 20 μm×20 μm substantially equal to full width half maximum (about $2\sigma_b = 20$ μm). If the maximum possible beam size of the apparatus is 20 μm or more, only one unit figure (a rectangular shot in this case) need be set in the small region, and the number of shots is for 1):$(100 \times 100)/(10 \times 10^{-3} \times 10 \times 10^{-3}) = 1.0 \times 10^8$ for 2):$(100 \times 100)/(20 \times 10^{-3} \times 20 \times 10^{-3}) = 0.25 \times 10^8$ Therefore, the time required for correction radiation is
for 1):$1.0 \times 10^8 \times 200 \times 10^{-9} = 20$ sec
for 2):$0.25 \times 10^8 \times 200 \times 10^{-9} = 5$ sec That is, according to the fourth aspect of the present invention, the correction radiation time can be reduced to about 1/1000 that required in the conventional method. Even if the maximum beam size which the apparatus can set is smaller than 20 μ, the same effect as that described above can be obtained by setting a plurality of representative figures at the same position. For example, if N representative figures are set, the exposure dose is increased N times.

The present invention can be effectively applied to mask drawing with a lower accelerating voltage. In mask drawing, the accelerating voltage is generally set to be about 20 kV. In this case, since the backscattering value $\sigma_b$ of a reticle is 2 μm, the size of a region in which representative figures are set can be set to be about 3 μm×3 μm to 4 μm×4 μm. Therefore, in consideration of the fact that the minimum line width on the reticle is 1 μm, the number of shots required for correction drawing can be decreased by setting representative figures for a region including a small pattern.

A case wherein the condition "the region size can be increased up to about full width half maximum (about $2\sigma_b$) of the spread of backscattering" is applied to the exposure dose correction method will be described below.

According to the fifth aspect of the present invention, exposure dose with respect to representative positions set in units of small regions are calculated by using representative figures set in regions, each having a size nearly equal to or smaller than full width half maximum of the spread of backscattering. Since the calculation results are used as set values of the original IC patterns, optimal exposure dose for the original patterns need not be directly calculated. As a result, the time required to calculate the optimal exposure dose can be greatly shortened.

In addition, the size of each small region in which a representative position is set and that of each region in which a representative figure is set are dependent on only an accelerating voltage and the type of a substrate but are completely independent of the characteristics (e.g., pattern density) of patterns to be drawn. If, for example, an accelerating voltage of 50 kv and an Si substrate are used, "2 μm×2 μm" may be sufficient for the size of each small region in which a representative position is set; and 1) "10 μm×10 μm" that is equal to the spread of backscattering, or 2) "20 μm×20 μm" that is substantially equal to full width half maximum, for the size of each region in which a representative figure is set.

That is, in "the step of calculating optimal exposure dose", which requires the maximum calculation time, the calculation time is completely independent of the packing density or pattern density of an LSI but is determined by only the number of small regions in which representative positions are set or the pattern density (1/(10 μm×10 μm):for 1), 1/(20 μm×20 μm):for 2) in the above case) of representative figures.

When representative figures are used in the ghost method, the size of each small region is set to be substantially equal to full width half maximum of the spread of backscattering. The reason for this will be described below.

The total absorbed energy amount at an arbitrary position x on a resist is represented by $$E_{tot}(x) = E_p(x) + E_c(x) \ldots \quad (18)$$

The first and second terms are respectively based on patterning drawing and correction drawing.

By using equation (18), $E_{tot}(x)$ is calculated with respect to the following line/space ratios: 1:1, 1:2, 1:7, 2:1, and 7:1, the differences between the calculation values and the maximum variation of Etot(x) are set as errors, and numerical calculations are performed. FIG. 1 shows the dependency of an error on the size of a region in which a representative figure is set. Referring to FIG. 1, a reference for the size of a region is represented by the ratio of Δ to $\sigma_b$. For example, when accelerating voltage is set to be 50 kV ($\sigma_b = 10$ μm), assume that a region size is set in a size of 12 μm width (Δ=6 μm) which is substantially equal to the spread of the backscattering $\sigma_b(=10$ μm). Even if correction drawing is performed with respect to a representative figure set in a region of 12 μm×12 μm, an error of energy accumulated in a resist is about 1%, and sufficient precision is ensured. Therefore, even if a region size is set in a size of 20 μm×20 μm (Δ=10 μm) substantially equal to full width half maximum (about $2\sigma_b = 20$ μm), since an error is 5%, sufficient precision is obtained. Therefor, even if a representative figure is set in a region having a size equal to or smaller than a full width half maximum of the spread of the backscattering (about $2\sigma_b$) such that its total area and center of gravity coincide with those of an original pattern, substantially the same precision can be obtained.

Referring to FIG. 1, the line segments represent errors in the conventional method (ghost method), and the gradients of the lines represent errors with respect to the setting of representative figures. It is apparent from the gradients of the lines that the errors accompanying the setting of the representative figures are smaller than those in a case wherein a pattern density of 50 is set, regardless of whether the pattern density is set to be higher or lower than 50%. This indicates that the setting of representative figures is only slightly limited by the step of pattern density.

When representative figures are used in the exposure correction method, the small region size can also be set to be substantially equal to a full width half maximum (about $2\sigma_b$) of the spread of backscattering. The reason for this will be described next. This is confirmed by the following numerical calculations.

Patterns to be drawn are substituted by representative figures having total areas and centers of gravity coinciding with those of the patterns in regions $2\Delta$, and optimal exposure dose at the positions of the centers of gravity of the respective representative figures are determined by the matrix method using the representative figures (Reference: M. Parikh, "*Corrections to proximity effects in electron beam lithography*", J. App. Phys., Vol. 50, No. 6, Jun. 1979, pp. 4371–4387). Absorbed energy amounts at arbitrary positions on the resist for which optimal exposure dose of the patterns in the respective regions are set are estimated, with respect to the following line/space ratios: 1: 1, 1: 2, 1: 7, 2: 1, and 7: 1. Variations in absorbed energy in the respective regions in which the representative figures are set are estimated as errors in accordance with deviations of the absorbed energy at the positions of the centers of gravity from predetermined values.

The absorbed energy amount at an arbitrary position on the resist is represented by $$E(x) = \sum_i \int D_i \cdot \left\{ \delta(x - x') + \frac{\eta E}{\pi \sigma_b^2} \exp\left( - \frac{(x - x')^2}{\sigma_b^2} \right) \right\} \quad (19)$$

where $D_i$ is the optimal exposure dose in an i-th region by the matrix method.

FIGS. 2 and 3 show errors estimated from the results of numerical calculations according to equation (19). FIG. 2 shows errors estimated from the maximum and minimum absorbed energy amounts in regions in which the same optimal exposure dose is set. FIG. 3 shows errors estimated from deviations of absorbed energy amounts at the positions of the centers of gravity of the respective representative figures from the predetermined values. The size of each region for which the same exposure dose can be set can be estimated from FIG. 2. From FIG. 3, the size of each region for determining a representative figure for calculating an optimal exposure dose can be estimated.

From FIG. 2, the size of each region for which an exposure dose is set may be sufficiently smaller than $\sigma_b$. On the other hand, from FIG. 3, the size of each region in which a representative figure used for calculating an optimal exposure dose is set may be set to be substantially equal to or smaller than a full width half maximum of the spread backscattering (about $2\sigma_b$). Assume that an accelerating voltage of 50 kv is set. In this case, if $\sigma_b = 10$ μm, and the size of each region for which an exposure dose is set is 2 μm×2 μm, an error can be suppressed to about ±2%, if the size of a region in which a representative figure is set is 12 μm×12 μm which is substantially equal to the spread of backscattering ($\sigma_b 10$ μm), an error can be suppressed to about 1.3%, and if the size of a small region is a full width half maximum (about $2\sigma_b = 20$ μm), an error can be suppressed to about 5%.

As described above, the size of a region for which an exposure dose is set and that of a region in which a representative figure is set are determined by only allowable errors and the spread of backscattering (an accelerating voltage and the type of a substrate) but are completely independent of the density of patterns to be drawn.

As described in detail above, according to the first, second and fourth aspects of the present invention, in correction radiation, the entire lithographic region is divided into small regions, each having a size smaller than the spread of the backscattering of an electron beam or substantially equal to or smaller than the full width half maximum of the spread of the backscattering. In addition, representative figures are set in units of small regions and are irradiated, thereby decreasing the number of shots in correction radiation. Therefore, the time required for correction radiation can be shortened, and the throughput can be improved.

According to the third aspect of the present invention, since it is only required that correction exposure dose for representative figures, which are set in the respective small regions in place of patterns to be drawn, be calculated, the time required for correction calculations can be greatly shortened.

According to the fifth aspect of the present invention, in place of patterns to be drawn, representative figures are set in units of regions, each having a size substantially equal to or smaller than the full width half maximum of the spread of backscattering, and exposure dose at the positions of the centers of gravity of the patterns in small regions, each having a size sufficiently smaller than $\sigma_b$, are calculated by using the representative figures. Therefore, the time required for correction calculations can be greatly shortened.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a graph showing a relationship between an error, caused when correction drawing is performed with respect to a representative figure with a defocused electron beam, and the size of a region $\Delta$ in which the representative figure is set;

FIG. 3 is a graph showing a relationship between an error, caused at the position of the center of gravity of a pattern in a region when exposure dose correction is performed by the matrix method using a representative figure, and the half size of the region Δ;

FIGS. 6A to 6C are views respectively showing a pattern to be subjected to correction radiation and a beam exposure dose distribution on a wafer;

FIG. 7 is a block diagram showing the detailed arrangement of a main part of the apparatus in FIG. 4;

FIG. 8 is a view showing a representative figure in Example 2;

FIG. 9 is a view for explaining Example 3 and shows a figure written by a CAD system before it is redivided;

FIGS. 11A and 11B are views showing correction radiation regions in Example 6;

FIGS. 13A to 13D are views showing sequences of correction calculations with and without representative figures;

FIG. 14 is a view showing a model of an LSI pattern for a test;

FIG. 15 is a graph showing changes in correction calculation time with changes in design rule;

FIG. 16 is a view showing a sequence of processing in a case wherein "a method of using approximation formulae for optimal exposure dose" is used as the algorithm of correction calculations without using representative figures;

FIG. 18 is a view showing a sequence of processing in a case wherein the same calculation algorithm as that in FIG. 16 is used together with a representative figure;

FIGS. 19A and 19B are views showing images of an exposure dose correction scheme employed when no representative figures are used;

FIG. 21 is a view showing a sequence of processing in a case wherein the same calculation algorithm as that in FIG. 18 is used together with representative figures;

FIG. 23 is a graph showing changes in correction calculation time with changes in design rule.

DETAILED DESCRIPTION OF THE PREFERRED EMBODIMENTS

Embodiments of the present invention will be described below with reference to the following drawings.

The first embodiment of the present invention will be described below.

Figure 2:
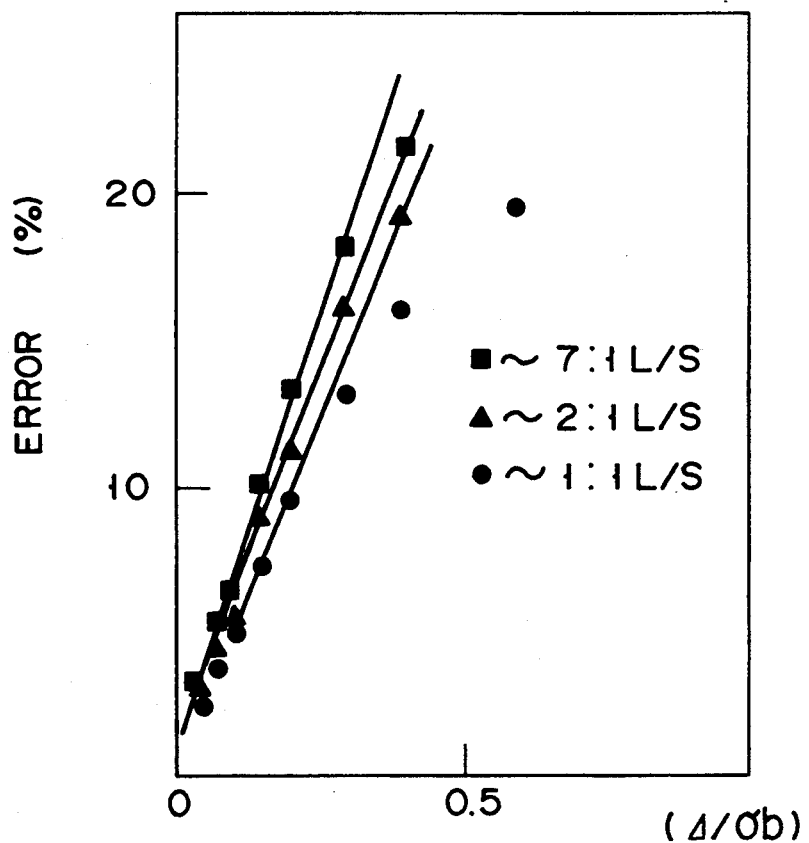
FIG. 2 is a graph showing a relationship between an error, caused at an edge portion of a pattern when exposure correction is performed by the matrix method using a representative figure, and the half size of the region $\Delta$ in which the representative figure is set.
Figure 4:
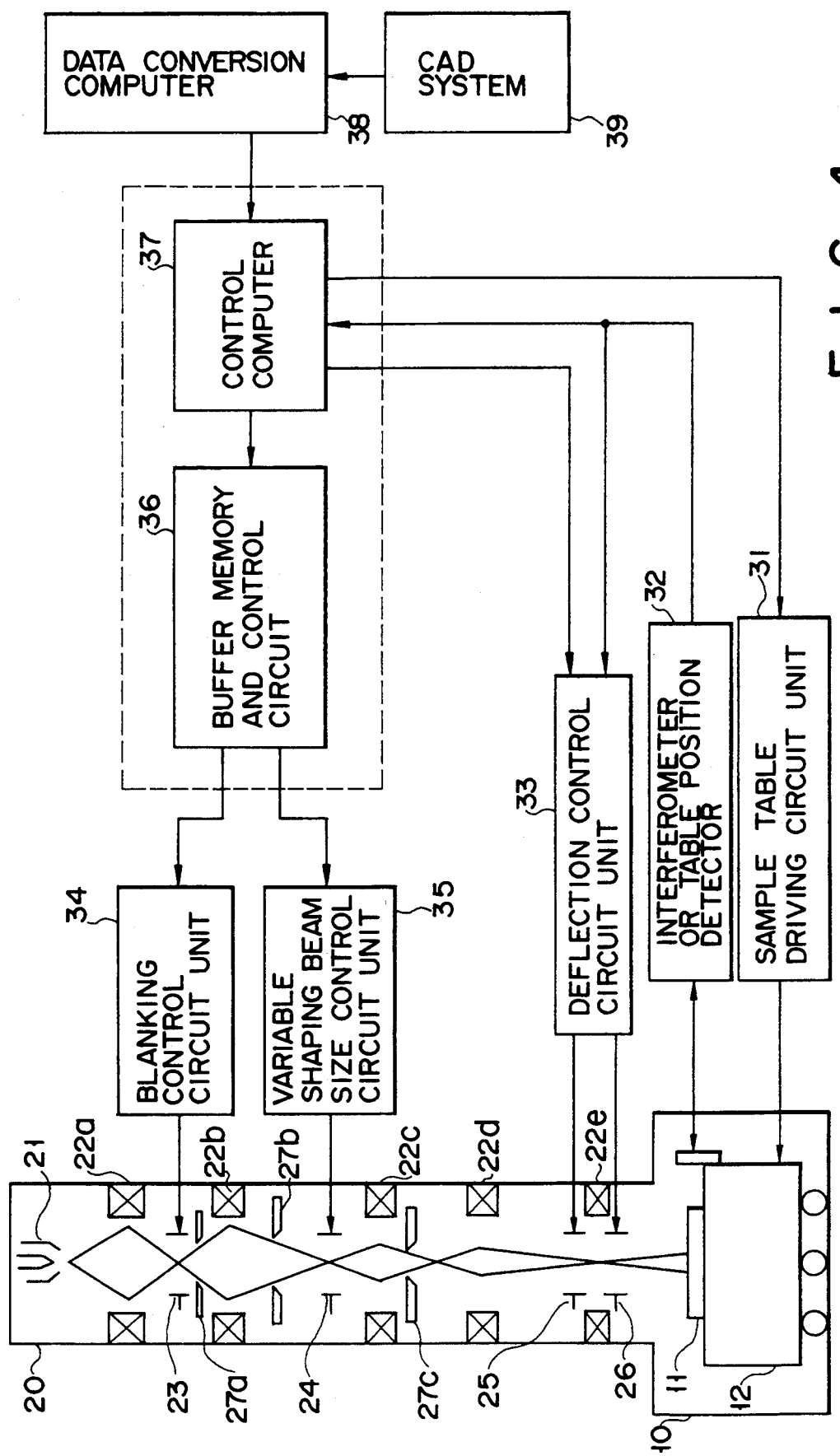
FIG. 4 is a block diagram showing the schematic arrangement of an electron beam lithographic apparatus used in a method of an embodiment of the present invention.

FIG. 4 shows a schematic arrangement of an electron beam lithographic apparatus used in a method of the embodiment of the present invention. Referring to FIG. 4, the apparatus of the present invention includes a sample chamber 10, a target (sample) 11, a sample table 12, an electron optical system 20, an electron gun 21, lens systems 22a to 22e, a blanking deflector 23, a beam shaping deflector 24, scanning deflectors 25 and 26, a blanking plate 27a, beam shaping aperture masks 27b and 27c, a sample table driving circuit unit 31, a laser wave-length measurement system (Inferometer or table position detector) 32, a deflection control circuit unit 33, a variable shaping beam size control circuit unit 35, a blanking control circuit unit 34, a buffer memory and control circuit 36, a control computer 37, a data conversion computer 38, and a CAD system 39. An electron beam emitted from the electron gun 21 is on/off-controlled by the blanking deflector 23. The apparatus can change the exposure dose for each radiation position by adjusting the ON-OFF radiation time of the electron beam. The beam passing through the blanking plate 27a is shaped into a rectangular beam by the beam shaping deflector 24 and the beam shaping aperture masks 27b and 27c. The size of the rectangular beam is changed by the beam shaping aperture masks 27b and 27c. The shaped beam is deflected/scanned on the target 11 by the scanning deflectors 25 and 26. With this beam scanning, desired patterns are drawn on the target 11. In the apparatus of the present invention, the standard accelerating voltage for an electron beam is set to be 50 kv, and the maximum size of a rectangular variable-shaped beam which can be formed is 2 μm (height)×2 μm (width).

Electron beam lithographic methods using the above0described apparatus, especially methods of correcting the proximity effects, will be described below with reference to FIGS. 5 to 12.

The accelerating voltage of the apparatus was set to be 50 kV, the standard accelerating voltage. In this case, as described above, the size of each small region may be set to be 2 μm×2 μm. Since the size of each small region is equal to the maximum beam size which the system can set, exposure dose Qc for all representative figures in the correction mode are set to be the same:

$$Q = Q_c = Q_p \times \eta_E / (1 + \eta_E)$$

where Qc is the standard correction exposure dose with respect to an original figure, and Qp is the exposure dose in the pattern drawing step. That is, in this scheme, only the beam size is controlled.

Figure 5A:
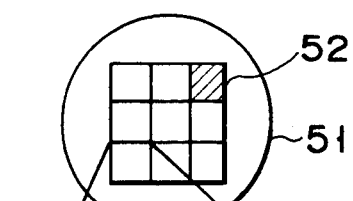
FIGS. 5(a) to 5(c) are plan views showing images of small regions formed on a wafer.
Figure 5B:
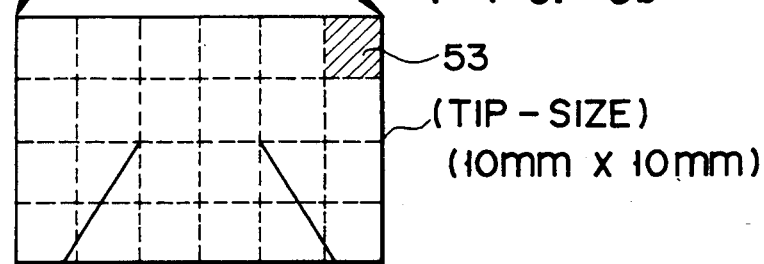
Figure 5C:
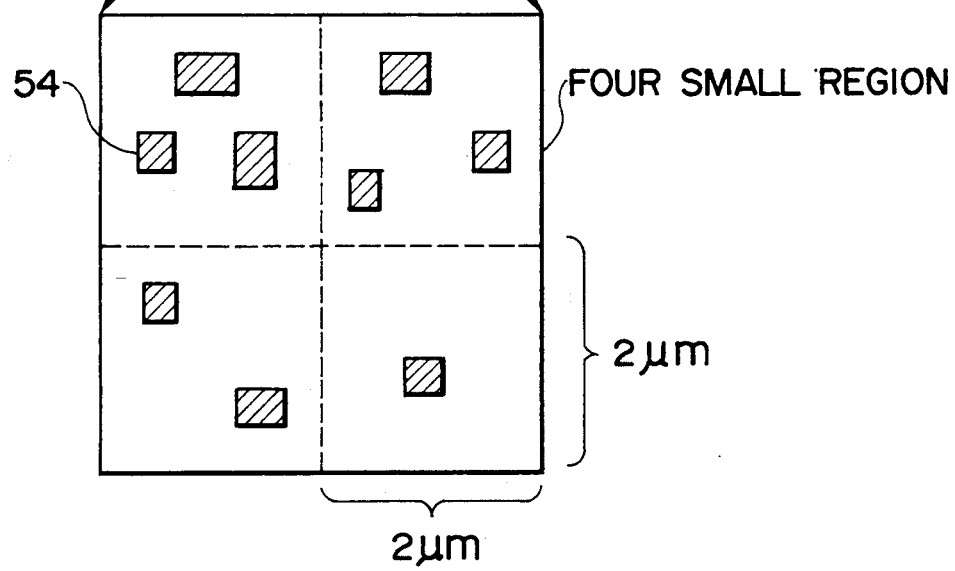

FIGS. 5(a) to 5(c) illustrate small regions on a wafer (or a mask). FIG. 5(a) shows a state wherein a plurality of chip regions 52 are arranged on a wafer 51. FIG. 5(b) shows a state wherein a plurality of small regions 53 are arranged in one of the chip regions 52. FIG. 5(c) is an enlarged view of four small regions, in which hatched portions are set to be desired patterns 54 to be drawn.

In the conventional method, patterns to be subjected to correction radiation are illustrated as hatched portions in FIG. 6A, in which the number of patterns to be subjected to correction radiation in the upper left small region is eight. In contrast to this, if representative figures are set in units of small regions as in this embodiment, the number of patterns to be subjected to correction radiation in each small region is one, as shown in FIG. 6B. The unit figure representing the upper left small region in FIG. 6B is set to be a square of L μm×L μm, and its size is determined according to $$L^2 = (S1 \text{ to } S8)$$

where S1 to S8 are the areas of FIGS. 1 to 8 in the upper left small region in FIG. 6B.

If the method of this embodiment is employed, only the hatched portions in FIG. 6B are required to be drawn. For example, with respect to the upper left small region, radiation must be performed eight times in the conventional method. In contrast to this, the method of this embodiment requires only one radiating operation. FIG. 6C shows an exposure distribution on the wafer in relation to one of the representative figures formed as shown in FIG. 6B. By using the aperture masks 27b and 27c, the beam is shaped as in FIG. 6B. However, since the beam is defocused on the wafer surface, it is shaped as in FIG. 6C.

The above embodiment will be described in more detail below.

EXAMPLE 1

Two types of EB data are formed in an offline manner. One data is EB data (DATA-1) corresponding to desired patterns which correspond to FIG. 5(c). The other data is EB data (DATA-2) used for correction radiation, which corresponds to FIG. 6A. These EB data are stored in a disk of an EB apparatus, and the patterns represented by the DATA-1 are drawn while a beam is focused on the wafer surface. In this case, the exposure dose was set to be 50 $\mu C/cm^2$.

Subsequently, correction radiation is performed to correct the proximity effects various types of control in the correction radiation are performed by a portion enclosed within the dotted line in FIG. 4. FIG. 7 shows the detailed arrangement of the portion. This beam is defocused to have a beam size dc [22.8 $\mu m$] on the wafer surface. Thereafter, the control computer supplies the DATA-2 to a buffer memory $M_1$, stores the length (2.0 $\mu m$) of one side of each small region in registers $R_1$ and $R_2$, and starts circuits $A_1$ and $A_2$.

In the above-described state, a lithographic operation is performed while the standard correction exposure dose Qc is set to be 20.55 $\mu C/cm^2$. At this time, the circuits A1 and A2 perform the following operations:

1) The lithographic region is divided into 2 $\mu m \times 2$ $\mu m$ squares (the circuit A1).
2) All figures are assigned to the respective small regions. In this case, if a given figure extends across two or more regions, the figure is divided into portions, and the portions are assigned to the small regions.
3) One representative figure is set for each small region in the following steps (a) to (c) (the circuit A2):

(a) totaling the areas of figures included in each small region
   (b) calculating the square root of the value obtained in step (a)
   (c) setting a representative figure to be a square having the length of the value obtained in step (b)

When a lithographic operation and correction radiation were performed in accordance with steps (a) to (c), the correction precision of the proximity effects fell within measurement errors and was substantially the same as that in the conventional method.

In the method of this Example, correction radiation is performed while one representative figure is set for each small region, a size S of each representative figure is set to be $$S = \sum_i S_i$$

where $S_i$ is the area of an original unit figure i included in each small region, and the exposure dose Q for each representative figure is set to be equal to the standard correction exposure dose Qc. With this operation, the proximity effects can be corrected in the same manner as in the conventional ghost method. In addition, according to the method of this Example, since only one representative figure is required to be set for each small region, the time required for correction radiation can be shortened, and the throughput can be increased.

In the above-described Example, correction radiation is performed by adjusting only the area of each representative figure. However, correction radiation can be performed as in Examples 2 to 7 below.

EXAMPLE 2

The functions 3) of the circuit A in Example 1 are replaced with the following functions (a)' to (c)', and [Qc/area of small region]=16.6/4 =4.1 is set in a register $R_2'$:

(a)' totaling the areas of figures included in each small region
(b)' multiplying the value obtained in step (a)' by the value of the register $R_2'$
(c)' setting a representative figure to be a square having the value (2.0) of the register R as shown in FIG. 8, and setting an exposure dose therefore to be the value obtained in step (b)'

As in steps (a)' to (c)', the size of each representative figure is set to be the same as that of each small region, and exposure dose are set in accordance with the total area of figures included in each small region. With this operation, the proximity effects can be corrected in the same manner as in Example 1.

EXAMPLE 3

In Examples 1 and 2, determination of a representative figure, which is performed by the circuit A, may be performed by the control computer or a computer independent of the system so as to form EB data in which each representative figure becomes a unit figure (shot) of a lithographic operation.

In the determination of the representative figures, an input operation need not be performed by using finely divided patterns in FIG. 6A. Instead of such patterns, figures as shown in FIG. 9, which are described, before they are finely divided, when the patterns are inverted by the CAD system, may be used.

EXAMPLE 4

In the apparatus shown in FIG. 4, the electrooptic system was adjusted to set an accelerating voltage of 70 kV. In this case, $\sigma_b \approx 14$ $\mu m$ and $\eta_E = 0.5$. A maximum beam size Smax is 1.4 $\mu m$, and a maximum exposure dose Dmax of the apparatus is 70 $\mu C/cm^2$. When an exposure dose for patterning is 50 $\mu C/cm^2$, the standard correction exposure dose Qc becomes 20.55 $\mu C/cm^2$. Since the spread of backscattering at 70 kv is defined by $\sigma_b = 14$ $\mu m$ and $3\sigma_b = 42$ $\mu m$, the size of each small region can be increased up to 4 $\mu m$. Although the small region size may be set to be 1.4 $\mu m$ and the method in Examples 1 to 3 may be used, correction radiation can be performed at higher speed by the following method. The small region size is set to be 4 $\mu m$, and a representative figure whose maximum size is 1.4 μm is selected for each small region as follows:

(a) Areas $S_i$ of FIGS. i included in the respective small regions are totaled $$\left(\sum_i S_i\right).$$

(b) The value of y in the following equation is obtained:

y = [value obtained in step (a) × (20.55) μC/cm²]

(c) A representative figure count N is obtained according to the following equation:

N = minimum natural number equal to or more than [y/{70 μC/cm² × (1.4 μm²)}]

(d) A representative figure is determined as follows:

The exposure dose Q is set to maximum exposure dose 70 μC/cm².

A representative figure is set to be a square. The area of this figure is set to be $\sqrt{y/N}$.

The center of the representative figure is set to coincide with the center of a corresponding small region or the center of gravity of patterns in a corresponding small area.

In this Example, when the maximum beam size and maximum exposure dose of the lithographic system are respectively represented by $B_{max}$ and $Q_{max}$, the number N of representative figures set in each small region is set to be the minimum natural number equal to or more than $$\left(\sum_i (S_i) \times Q_c\right)/(B_{max} \text{ and } Q_{max}).$$

Therefore, the time required for correction radiation can be shortened, and correction radiation can be performed at higher speed.

EXAMPLE 5

In Example 4, the EB data is formed in an offline manner. However, a special circuit for EB data may be used, as in Examples 1 and 2. Furthermore, in Example 4, the center of a representative figure is set to coincide with that of small regions. However, a representative figure may be moved in the range in which the center of the figure is included in each small region.

Figure 10A:
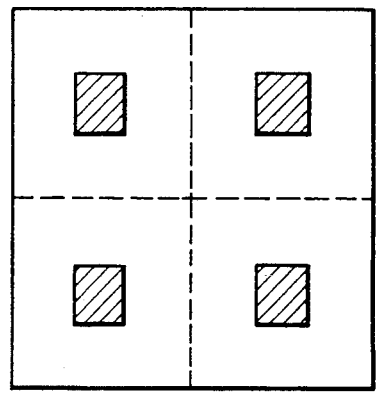
FIGS. 10A to 10C are views showing representative figures in Example 5.
Figure 10B:
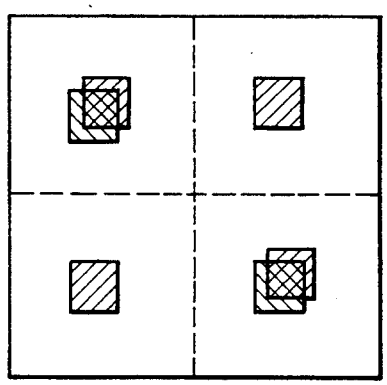
Figure 10C:
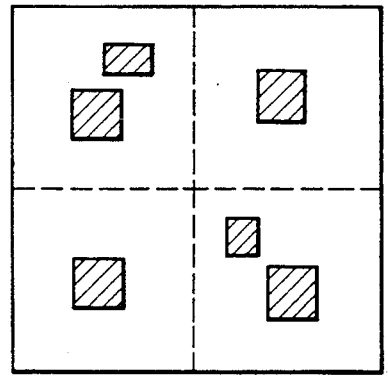

If (the maximum shot size) ≧ (the total area of figures in a small region), one representative figure is set in the small region, as shown in FIG. 10A. If (the maximum shot size) < (the total area of figures in a small region), two or more representative figures are set in the small region. If two or more representative figures are to be set, the figures may overlap each other, as shown in FIG. 10B, or may be separated from each other, as shown in FIG. 10C. Instead of setting a plurality of figures, the time for one shot may be prolonged.

EXAMPLE 6

In Examples 1 to 5, the variable-shaped beam scheme lithographic apparatus is used. The present invention, however, can be applied to vector (scheme) and raster scan scheme lithographic apparatuses. An example of such application will be described below with reference to FIGS. 11A and 11B.

A system of a 20 kV raster scan scheme will be exemplified. In this case, the small region size can be set to be about 0.5 μm. The size of a Gaussian beam is set to be 0.1 μm.

Figure 11A:
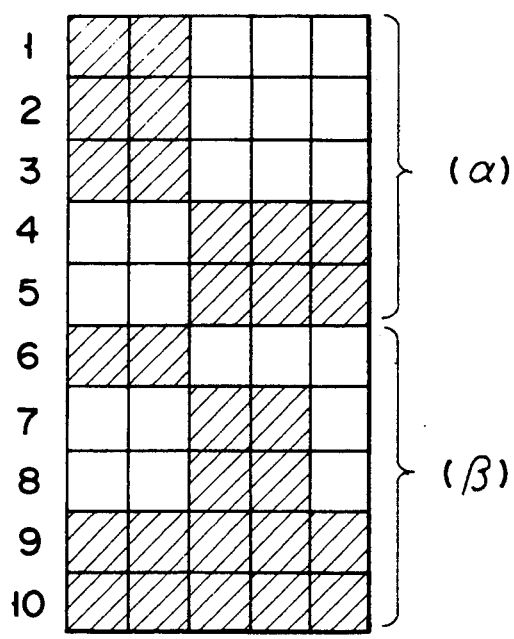

Referring to FIG. 11A, hatched portions are regions on which a beam is radiated during correction radiation in the conventional method. A region denoted by (a) includes small regions, each of which has a square shape having an area of 0.1 μm × 0.1 μm. The patterning exposure dose Qp and the standard correction exposure dose Qc are respectively set to be 20 μC/cm² and 8.57 μC/cm².

This Example is realized as follows:

(a) The scan speed and cycle are set to be the same as those in a patterning drawing step.

(b) Since the region size is five times the gaussian beam size, the beam current is set to be 5 × (Qc/Qp) = 5 × (8.57/20) = 2.14 (times)

(c) The table speed is set to be five times that of the conventional method.

(d) The beam is defocused to have a radius of 3.12 on the sample surface.

(e) Beam scanning is performed only once for each small region, as shown in FIG. 11B.

(f) The number of times that the beam is turned on in the scanning operation in step (e) is determined as follows:

The number of regions, each having a size of (0.1 μm)², which are present in each small region is represented by N (TOT), the number of times that the beam is turned on in each small region is represented by N (ON), and the number of times that the beam is turned on in this Example = [an integer obtained by rounding N (ON)/$\sqrt{N\text{ (TOT)}}$].

As described above, in this Example by setting a representative figure larger than a small square in the raster scan scheme electron beam lithography, the number of times that a beam is turned on can be decreased as compared with the conventional method, and the time required for correction radiation can be shortened. More specifically, the number of times that a beam is turned on in the small region in the conventional method shown in FIG. 11A is 12. In this Example, since $$N(ON)/\sqrt{N(TOT)} = 12/\sqrt{25} = 2.4,$$

the number of times that the beam is turned on is only two.

EXAMPLE 7

The present invention can be applied to a character projection scheme. An example of such application will be described below with reference to FIGS. 12A to 12F.

Figure 12A:
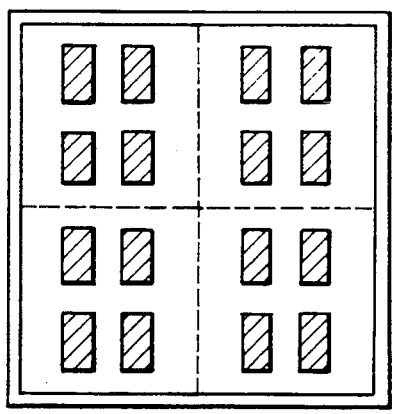
FIGS. 12A to 12F are views for explaining Example 7 and show a pattern to be drawn, correction radiation regions, and shaping apertures.
Figure 12B:
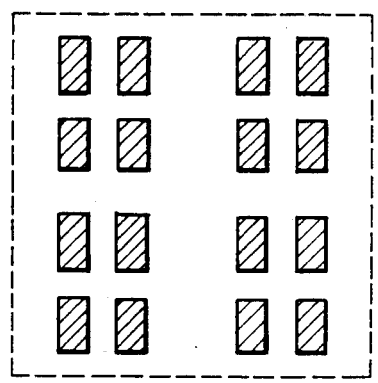
Figure 12C:
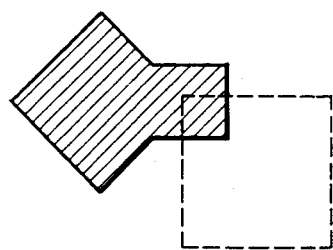

In the character projection scheme, hatched portions as figures in FIG. 12A are simultaneously radiated by one shot. FIG. 12B shows shaping apertures (hatched portions correspond to aperture openings). When the figures in FIG. 12A are to be radiated, the aperture images are formed in the region enclosed within a dotted line in FIG. 12B. When patterns other than those in FIG. 12A are to be drawn, the optical overlapping of two shaping apertures as shown in FIG. 12C is used.

Figure 12D:
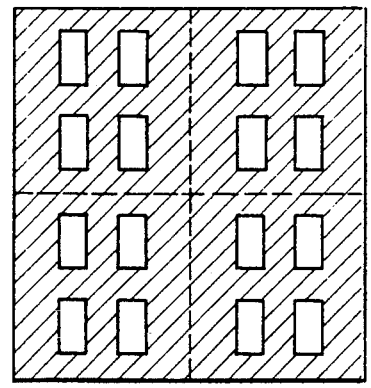
Figure 12E:
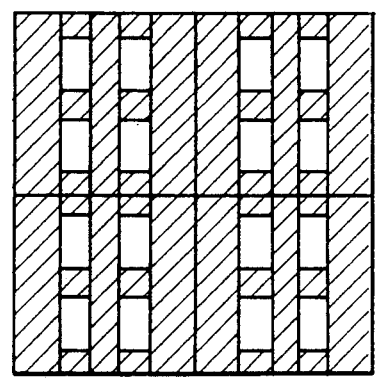

The conventional proximity effect correction method cannot be applied to this case. In the conventional method, patterns in FIG. 12D must be drawn during correction radiation while the beam is defocused. In order to radiate these patterns by the character projection scheme, a shaping aperture having an opening corresponding to a hatched portion in FIG. 12D is required. However, a shaping aperture having an opening in which a mask is present as shown in FIG. 12D cannot be formed. If the apertures shown in FIG. 12C are used in correction radiation, the number of shots is increased as shown in FIG. 12E. As a result, the radiation time is greatly increased.

In contrast to this, if the method of this Example is used, correction radiation can be realized as follows. A region on which figures are drawn by one character projection is divided into small regions. Representative figures are set in the respective small regions. The beam is defocused, and the respective representative figures are drawn by using the apertures in FIG. 12F. In this case, the number of figures subjected to correction radiation is greatly reduced as compared with FIG. 12E, and the time required for correction radiation can be shortened. Note that the size of each representative figure may be set in the same manner as in Example 1.

Figure 12F:
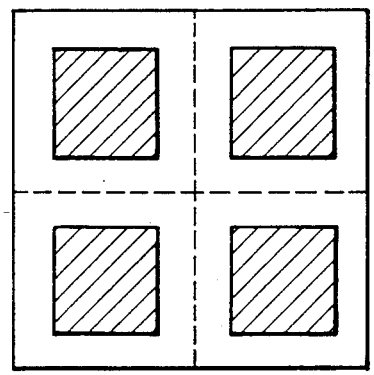

Correction radiation can be performed by using a shaping aperture shown in FIG. 12F. In this case, four small regions require only one correction radiation, and hence correction radiation can be performed at higher speed. In addition, if the exposure dose is adjusted as in Example 2, the aperture shown in FIG. 11B can be used.

In the above description, although each of regions (all correction regions) in which representative figures are set is set to be a region smaller than the spread of the backscattering of an electron beam $\sigma_b$, each region may be increased substantially in size up to the spread of backscattering of the electron beam $\sigma_b$ or the full width half maximum of the distribution of the backscattering of the electron beam (about $2\sigma_b$). More specifically, when an accelerating voltage of 50 kv is set ($\sigma_b=10$ μm), a representative figure can be set in a region of 10 μm×10 μm or 20 μm×20 μm. The representative figure is set such that its area and 10 center of gravity coincide with the total area and center of gravity of patterns within the corresponding region.

In Example 1, the circuit A 1 has the function of dividing a lithographic region into small regions, each having a size of 10 μm×10 μm (or 20 μm×20 μm), and the circuit $A_2$ has the function of obtaining the center of gravity of a pattern in each small region and causing the position of the center of gravity to coincide with the center position of the square. In Example 4, the size of each small region can be set to be 15 μm×15 μm (or 30 μm×30 μm), and the center (center of gravity) of a representative figure is caused to coincide with the center of gravity of patterns in the region. In the system of the raster scan scheme in Example 6, when an accelerating voltage of 20 kV is set, the size of a region in which a representative figure is to be set can be set to be 3 μm×3 μm.

The second embodiment of the present invention will be described below.

In Examples 1 to 7, the methods of correcting the proximity effects by correction radiation are described. However, instead of performing correction radiation as in Examples 1 to 7, an exposure dose in a drawing operation can be corrected to reduce the proximity effects without correction radiation.

With respect to a lithographic region having a plurality of figures as shown in FIG. 13A, in the conventional method (using no representative figures), optimal exposure dose are determined in units of figures by using the matrix method, as shown in FIG. 13B. For this reason, if the number of figures is increased, the time required to calculate optimal exposure dose is greatly increased. Although the values (exposure dose) assigned to the figures in the same region enclosed within a dotted line are the same, these values are set by a method to be described later. In the conventional method, however, different values may be set in the same region.

In this embodiment, as shown in FIG. 13C, the lithographic region is divided into small regions (enclosed within dotted lines), each of which is smaller than the spread of the backscattering of an electron beam and is larger than the minimum possible figure. In addition, one representative figure different from a pattern to be drawn is set in each small region ($B_1$). In this case, the area and position of the center of gravity of the representative figure in each small region are set to coincide with the total area and position of the center of gravity of patterns to be drawn. Subsequently, as shown in FIG. 13D, optimal exposure dose are determined, assuming that the representative figures are drawn ($B_2$). Thereafter, the exposure determined with respect to the representative figures belonging to the respective small regions are determined as exposure dose for the patterns to be drawn, which are included in the respective small regions, as shown in FIG. 13B ($B_3$).

As described above, in the method of this embodiment, the number of figures for which optimal exposure dose are to be calculated is much smaller than that in the conventional method. Therefore, the calculation time required to determine optimal exposure dose can be greatly reduced. This embodiment will be described by way of its examples below.

EXAMPLE 8

FIG. 14 shows a model of an LSI pattern having an array structure. FIG. 15 shows the time required for proximity effect correction with respect to the LSI model in cases wherein representative figures are used and are not used, respectively. The matrix method was used for the algorithm of correction calculations. The multiplication speed of a computer which was used is [10 nsec/multiplication]. An accelerating voltage of 50 kV and an Si substrate were used, while $\sigma_b$10 μm and the size of each small region was set to be 2 μm×2 μm.

The correction time can be shortened by using an array structure. In this Example, however, such a scheme is not employed, and correction calculations are performed after all the arrays are expanded. When a representative figure is used, the center of the representative figure is used as a representative point. When no representative figure is used, the center of gravity of each pattern is used as a representative point. As is apparent from FIG. 14, the density of patterns is 10 figures/72$l^2$ (l is the design rule).

If no representative figures are used, the correction calculation time by means of the matrix method is prolonged by the third power of a pattern density $\rho$. For this reason, this calculation time is prolonged by $(1/l)^6$ with a reduction in design rule with the reduction in design rule, the actual calculation time is greatly prolonged. As a result, it is practically impossible to perform correction calculations with a design rule smaller than 0.5 μm.

If representative figures are used as in the method of this Example, since the calculation time is not dependent on the density of original patterns, substantially the same processing time is required from a rule of 1 μm to a rule of 0.125 μm. Especially, for a rule of 0.5 μm or less, the calculation time is greatly shortened as compared with the conventional method using no representative figures.

Correction effects obtained by performing proximity effect correction with respect to the patterns in FIG. 14 by using only the matrix method and by using both the matrix method and the method of this Example were respectively checked by using the electron beam lithographic apparatus. In either case, a size variation due to proximity effect correction was ±0.02 μm, which fell within the range of measurement errors. Therefore, it is understood that the degradation in correction precision due to the method of this Example poses no practical problems.

EXAMPLE 9

In Example 8, representative figures are set even for a design rule of 1 μm (pattern density: 1/7.2 μm²), and correction calculations are performed by using the representative figures.

In execution of the present invention, however, the method of Example 8 can be used more flexibly. When representative figures are to be set, the number of representative figures set in small regions is compared with the number of original figures. If the latter is smaller, the original figures can be directly used. According to this method, the time required for correction calculations can be shortened even if a relatively large design rule is set.

EXAMPLE 10

In Example 8, the matrix method is used as the algorithm of correction calculations. However, other algorithms may be used. For example, a currently proposed method of using approximation formulae for correction exposure dose (Reference: J. M. Parkovich, "*Proximity effect correction calculations by the integral approximate solution method*", J. vac. Sci. Technol. B, Vol. 4, No. 1, Jan/Feb (1986), pp. 159–163, and T. Abe et al., "*Proximity Effect Correction for Electron Beam Exposure dose EX-7*", Proceeding of 1st Micro Process Conference, pp. 40–41) may be used as the algorithm of correction calculations, and this algorithm and the present invention can be used together.

Figure 17B:
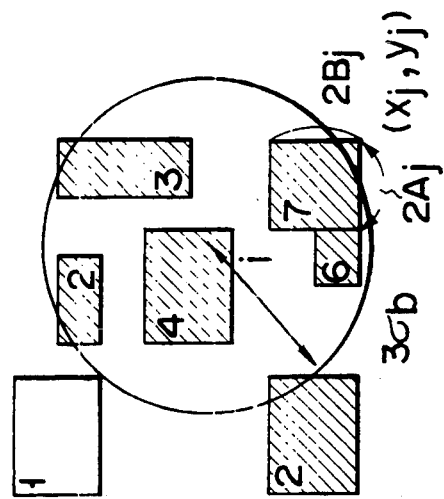
FIGS. 17A and 17B are views showing small figures to be corrected and reference rectangles.
Figure 17A:
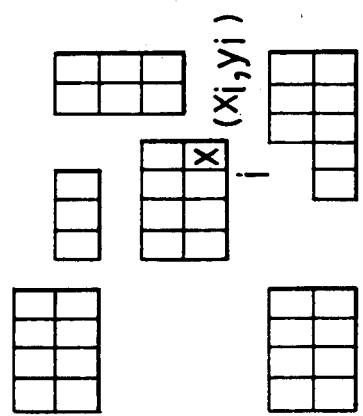

FIG. 16 shows the correction calculation algorithm described above. In step 1, a pattern to be drawn is divided into small figures, and data for storing the results of correction calculations is formed. In this case, the pattern is to be divided into figures, each having a size sufficiently smaller than $\sigma_b$. In step 2, reference data used for correction calculations is formed. In this case, the pattern is divided into rectangular portions, each having a size set to be as large as possible regardless of $\sigma_b$. In step 3, with respect to one small figure i, a correction exposure dose is determined as follows:

1) Of reference rectangles in the data, rectangles which are present within the range of $3\sigma_b$ around the small figure i are extracted, as shown in FIGS. 17A and 17B. In this case, hatched portions (2 to 7) in FIG. 17B are figures used for correction processing, but other figures (1) are not used.

2) Assuming that the center position of the small figure i is represented by $(x_i, y_i)$ and the center and size of each reference rectangle selected in 1) are respectively represented by $(X_j, Y_j)$ and $(2A_j, 2B_j)$, a correction exposure dose $D_i$ is obtained as an exposure dose for the small figure i by $$D_i = 1 - k \cdot U_i$$
$$U_i = \sum_j [erf\{(X_j - x_i + A_j)/\sigma_b\} - erf\{(X_j - x_i - A_j)/\sigma_b\}] \times [erf\{(Y_j - y_j + B_j)/\sigma_b\} - erf\{(Y_j - y_i - B_j)/\sigma_b\}]$$

where k is a parameter for correction, which is set to be 0.4 when an Si substrate and an accelerating voltage of 50 kV are used. U is a reference value for the absorbed energy amount in a resist, which is based on backscattering.

The above method can be used together with the method of the present invention, as shown in FIG. 18. Instead of performing step 1 in FIG. 1, data for storing the results of correction calculations is formed by using an original pattern in step i. In this case, the pattern is divided into small regions. If two or more figures are present in one small region, one representative figure is set in the small region in place of the figures.

Instead of performing step 2 in FIG. 16, reference rectangular data used for correction calculations is formed in step ii. In this case, the pattern is divided into rectangular portions, each having a size which is set to be as large as possible regardless of $\sigma_b$. If two or more figures are present in a small region, one representative figure is set in the small region in place of the rectangular figures.

Similar to step 3 in FIG. 16, in step iii, correction exposure dose are determined with respect to the small figures and the representative figure in the small region. Subsequently, in step iv, a radiation time is set for the original pattern by using the output results obtained in step iii.

In the above-described method, with respect to a relatively large figure, a pattern (to be drawn) in the corresponding small region is directly used. With respect to small figures, one representative figure is set in the corresponding small region, and exposure correction calculations are performed by using an approximation formula for a correction exposure dose together with the representative figure. With this operation, the time required for exposure dose correction even for a mixture of large and small patterns can be significantly shortened.

The third embodiment of the present invention will be described below.

In Examples 1 to 7, the methods of correcting the proximity effects by correction radiation are described. However, the proximity effects can be reduced without correction radiation except for that in lithography by correcting exposure dose during a lithographic operation instead of performing correction radiation.

According to the conventional method (using no representative figures), with respect to a lithographic region including a plurality of figures as shown in FIG. 19A, optimal exposure dose are determined in units of figures by using the matrix method, as shown in FIG. 19B. For this reason, as the number of figures is increased, the calculation time is enormously prolonged.

Figure 20A:
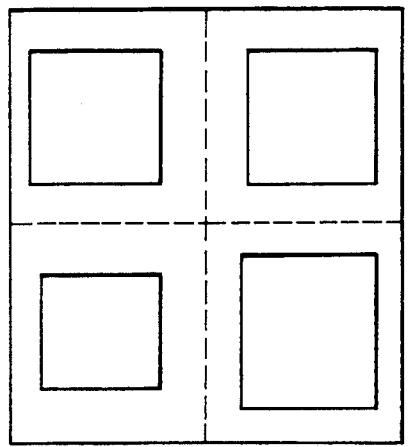
FIGS. 20A to 20D are views showing images of representative figure data (data 1) and representative position data (data 2) in a case wherein representative figures are applied to an exposure correction scheme.
Figure 20B:
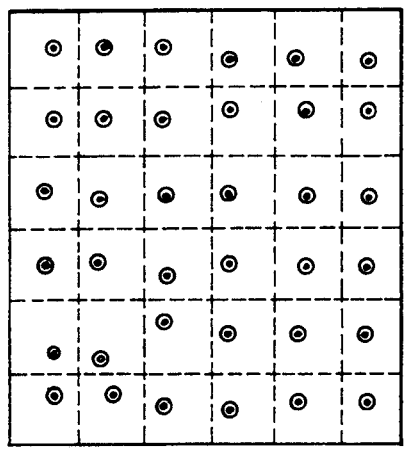
Figure 20C:
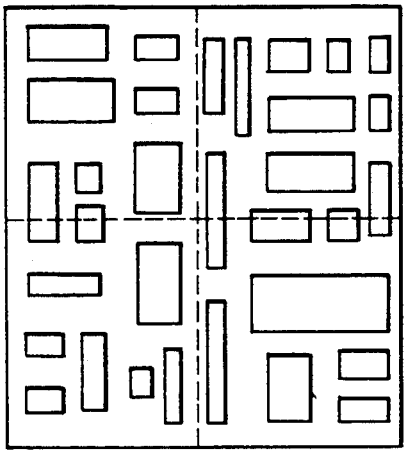
Figure 20D:
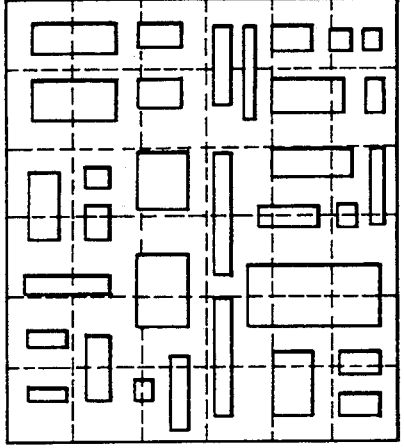

In this embodiment, as shown in FIGS. 20A and 20B, a lithographic region is divided into regions, each having a size equal to or less than the full width half maximum (about $2\sigma_b$) of the distribution of the spread of the backscattering of an electron beam, and data (data 1) representing representative figures, each of which is different from a pattern to be drawn in a corresponding region, is formed. In addition, as shown in FIGS. 20C and 20D, the lithographic region is divided into regions, each having a size sufficiently smaller than the spread of the backscattering of the electron beam, and data (data 2) is formed, independently of the data 1, by setting the position of the center of gravity of patterns to be drawn in each region to be a representative position. In the data 1, the area and position of the center of gravity of a representative figure are set to coincide with the total area and the position of the center of gravity of the patterns to be drawn.

Subsequently, optimal exposure dose at the respective representative positions of the data 2 are obtained by using the respective representative figures of the data 1. The obtained exposure dose are determined as optimal exposure dose for the patterns to be drawn in the regions of the data 2.

In the method of this embodiment, the number of figures used to calculate optimal exposure dose is much smaller than that in the conventional method. Therefore, the calculation time required to determine optimal exposure dose can be greatly shortened. This embodiment will be described by way of its example below.

EXAMPLE 11

A recently proposed method of using approximation formulae for correction exposure dose (Reference: J. M. Parkovich, "*Proximity effect correction calculations by the integral approximate solution method*", J. Vac. Sci. Technol. B, Vol. 4, No. 1, Jan/Feb (1986), pp. 159–163, and T. Abe et al., "*Proximity Effect Correction for Electron Beam Exposure dose EX-7*", Proceeding of 1st Micro Process Conference, pp. 40–41) can be used as the algorithm of correction calculations and applied to the present invention.

The above-described algorithm of correction calculations is illustrated in FIG. 16 and described in Example 10.

This method can be applied to the present invention, as shown in FIG. 21. Instead of performing step 1 in FIG. 16, data for storing the results of correction calculations is formed in step i. This data corresponds to the data 2 in FIGS. 20A to 20D. In this case, each of divided small regions has a size sufficiently smaller than $\sigma_b$, and the position of the center of gravity of all the patterns in each region is set to be a representative position. In step i, the pattern in each small region is represented by the position of the center of gravity of each region.

Instead of performing step 2 in FIG. 16, reference rectangular data used for correction calculations is formed in step ii. In this case, the lithographic region is divided into rectangular figures, each having a size which is set to be as large as possible regardless of $\sigma_b$. If a plurality of figures are present within a region equal to or less than the full width half maximum of the spread of backscattering (about $2\sigma_b$) or the spread of that $\sigma_b$, one representative figure is set, in place of the rectangular figures, in the region where the plurality of figures are present. This data corresponds to the data 1 in FIGS. 20A to 20D.

Similar to step 3 in FIG. 16, in step iii, correction exposure dose with respect to the representative positions in the respective regions are determined. In step iv, a radiation time is then set for the original pattern by using the output results obtained in step iii.

In the method of this Example, with respect to a relatively large figure, a pattern (to be drawn) in a region equal to or less than the full width half maximum of the spread of backscattering (about $2\sigma_b$) is directly used. with respect to small figures, one representative figure is set in the corresponding small region, and exposure correction calculations are performed by using an approximation formula for a correction exposure dose together with the representative figure. With this operation, the time required for exposure correction even for a mixture of large and small patterns can be greatly shortened.

Figure 22:
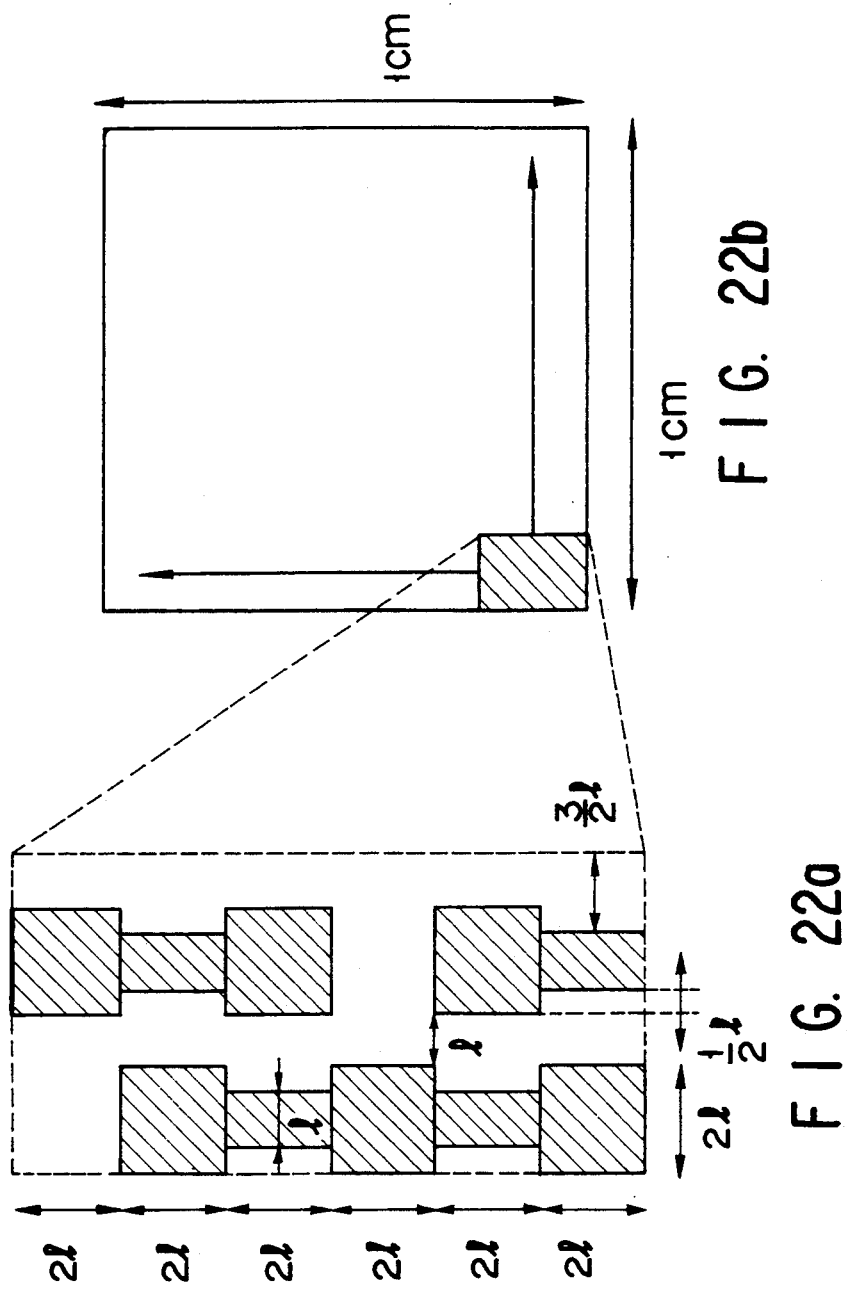
FIG. 22 is a view showing a model of an LSI pattern for a test.

FIG. 22 shows a model of an LSI pattern having an array structure. The calculation time, for the LSI model shown in FIG. 22, required when this Example is applied is compared with that required when representative figures and approximation formulae are used. The correction time can be shortened by using the array structure. In this case, however, such an operation is not performed, and correction calculation is performed after all the arrays are expanded. The size of a region for a representative figure was set to be 10 $\mu$m $\times$ 10 $\mu$m which size is equal to the spread of the backscattering $\sigma_b$, and a region for setting an exposure was set to be 2 $\mu$m $\times$ 2 $\mu$m.

As is apparent from FIG. 22, if a design rule is set to be 1 $\mu$m, the density of patterns is 10 figures/721$^2$. When an approximation formula for exposure correction is to be used, contributions from all figures present within a distance of $3\sigma_b$ from the corresponding figure are calculated. The number of figures present within $3\sigma_b$ is increased by $(1/L)^2$ when no representative figures are used. In contrast to this, if representative figures are used, the number of figures present within 394 $_b$ is independent of a design rule and is kept constant. FIG. 23 shows a relationship between the calculation time and the design rule in cases wherein representative figures are used and are not used when approximation formulae of exposure dose correction are used. As is apparent from FIG. 23, if representative figures are used, the calculation time is shortened to 1/10 for a design rule of 1 $\mu$m and to 1/1000 for a design rule of 0.1 $\mu$m. That is, if representative figures are applied to the exposure dose correction scheme, the time required for correction can be greatly shortened.

In addition, if the size of the region is set to 20 $\mu$m $\times$ 20 $\mu$m which size is equal to the full width half maximum of the spread of backscattering (about $2\sigma_b$), furthermore, the calculation time is shortened to $\frac{1}{2}^2 = \frac{1}{4}$.

The present invention is not limited to the above-described embodiments. In the embodiments, the variable-shaped beam scheme electron lithographic apparatus is used. However, the present invention can be applied to lithographic apparatuses other than the electron beam lithographic apparatus. The present invention is not limited to the specific application purpose of an electron beam lithographic apparatus. For example, in addition to the application purpose of directly forming resist patterns on wafers, the present invention can be applied to the formation of X-ray masks, optical stepper masks, reticles, and the like. various changes and modifications can be made within the spirit and scope of the invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An electron beam lithographic method including the step of drawing desired patterns on a sample by radiating an electron beam thereon, and the step of correcting an electron beam radiated on the sample before or after the step of drawing the desired patterns to reduce proximity effects due to backscattering accompanying pattern drawing, the beam correcting step comprising the steps of:

dividing an entire correction region into a plurality of regions, each having a size smaller than a spread of backscattering of said electron beam and larger than a minimum sized pattern which can be drawn, the patterns to be drawn being included in the plurality of regions;

determining one or more representative figure in each of said plurality of regions, each of said representative figures being based on the patterns to be drawn included in said plurality of regions, said one or more representative figures being smaller in a number than the number of radiation scans to be performed for drawing the patterns to be drawn obtained by black/white-reversing an original figure within said one of said plurality of regions;

setting an electron beam exposure dose for each of said one or more representative figures in corresponding ones of said plurality of regions;

defocusing the electron beams to increase a size of the beam to a size equal to the spread of said backscattering; and drawing each of said patterns to be drawn within each of the respective plurality of regions with the set exposure dose.

2. An electronic beam lithographic method including the step of drawing desired patterns on a sample by radiating an electron beam thereon, and the steps of correcting said electron beam radiated on the sample before or after the step of drawing the desired patterns to reduce proximity effects due to backscattering accompanying pattern drawing, the steps of correcting said electron beam comprising the steps of:

dividing an entire correction region into a plurality of regions, the patterns to be drawn being included in the plurality of regions;

determining one or more representative figures in each of said plurality of regions, each of said representative figures being based on the patterns to be drawn included in said plurality of regions, said one or more representative figures being smaller in number than the number of radiation scans to be performed for drawing the patterns to be drawn obtained by black/white-reversing an original figure within said one of said plurality of regions;

setting an electron beam exposure dose for said one or more representative figure included in each of the plurality of the regions;

defocusing the electron beam to increase a size of the beam to a size substantially equal to the spread of said backscattering; and drawing each of said patterns to be drawn within each of the respective plurality of regions with the set electron beam exposure dose.

3. A method according to claim 2, further including the steps of:

setting an exposure dose Qp for performing the step of drawing said desired patterns in said plurality of regions and a standard correction exposure dose Qc in the correction radiation step to satisfy $$Qc = Qp \times \eta_E/(1+\eta_E)$$

where $\eta_E$ is a ratio of a total absorbed energy amount of a resist, based on forward scattering of an electron beam, to a total amount of energy absorbed by the resist, based on backscattering of the electron beam; and setting a size dc of the defocused beam used in the correction radiation step to have the following relationship with a beam having a size of zero:

$$dc = 2\sigma_b/(1+\eta_E)^{\frac{1}{2}}$$

where $\sigma_b$ is a parameter set when the amount of where $\sigma_b$ is a parameter of backscattering.

4. A method according to claim 3, further including the step of setting an area $S_j$ of at least one representative FIG. $j$ included in one of said plurality of regions and an electron beam exposure dose $O_j$ to satisfy the following equation, provided that at least one representative figure is included in at least one of said plurality of regions:

$$\left(\sum_i S_i\right) \times Q_c = \sum_j ([S_j \times Q_j] S_j \times Q_j)$$

where $S_i$ is an area of a unit FIG. $i$ obtained by black/white-reversing an original figure within said one of said plurality of regions, and Qc is a standard correction exposure dose.

5. A method according to claim 2, further including the step of setting an area $S_j$ of at least one representative figure j included in one of said plurality of regions and an electron beam exposure dose $Q_j$ to satisfy the following equation, provided that at least one representative figure is included in at least one of said plurality of regions:

$$\left(\sum_i S_i\right) \times Q_c = \sum_j ([S_j \times Q_j] S_j \times Q_j)$$

where $S_i$ is an area of a unit figure i obtained by black/white-reversing an original figure within said one of said plurality of regions and Qc is a standard correction exposure dose.

6. A method according to claim 5, wherein an electron beam exposure dose Q of said at least one representative figure is equal to the standard correction exposure dose Qc, and an area S of the representative figure is $$S = \sum_i S_i$$

7. A method according to claim 5, wherein the size S of said at least one representative figure is equal to a size SΔ of said one of said plurality of regions, and the exposure dose Q is given by $$(Q = (Q_c/S\Delta) \times \sum_i S_i.$$

8. A method according to claim 5, wherein a plurality of representative figures are set in said one of said plurality of regions and said plurality is a number at least equal to a natural number represented by $$((\Sigma S_i) \times Q_c)/(B_{max} \times Q_{max})$$

where $B_{max}$ and $Q_{max}$ are a maximum area of the focused beam and a maximum electron beam exposure dose, respectively, which can be set by a lithographic system.

9. An electron beam lithographic method, wherein before desired patterns are drawn on a sample by radiating an electron beam thereon, an optimal electron beam exposure dose is determined in accordance with the position of said electron beam with respect to said patterns to be drawn, and the respective patterns are drawn with said optimal electron beam exposure dose, comprising the steps of:

dividing a lithographic region into a plurality of regions, each having a size smaller than a spread of backscattering of an electron beam and larger than a minimum sized pattern which can be drawn, the patterns to be drawn being included in the plurality of regions;

determining one or more representative figures representing the patterns to be drawn in at least one of said plurality of regions;

determining said optimal electron beam exposure dose for each of said one or more representative figures included in corresponding ones of said plurality of regions, by using the representative figures; and determining said optimal electron beam exposure dose for each of said patterns to be drawn within each of said plurality of regions, in accordance with the determined dose for said representative figure in the corresponding regions.

10. A method according to claim 9, wherein at least one representative figure is set in one of said plurality of regions and satisfies one of the conditions selected from the group consisting of:

1) the representative figure has an area equal to a total area of all patterns to be drawn which are present in said one of said plurality of regions, and 2) the area and geometric center of the representative figure coincide with the total area and the center of the area of the patterns to be drawn which are present in said one of said plurality of regions.

11. An electronic beam lithographic method, wherein before desired patterns are drawn on a sample by radiating an electron beam thereon, an optimal electron beam exposure dose is obtained in units of positions in the patterns to be drawn, and the patterns are drawn with the optimal electron beam exposure dose, the method comprising:

a first step of dividing a lithographic region into a plurality of first regions, each having a size smaller than a spread of backscattering of an electron beam and larger than a minimum sized pattern which can be drawn, the patterns to be drawn being included in the plurality of regions, and determining at least one representative figure, which is different from a pattern to be drawn therein, while determining patterns to be drawn in the remaining first regions as additional representing figures;

a second step of dividing the lithographic region into a plurality of second regions, each having a size larger than a minimum sized pattern which can be drawn and smaller than a spread of backscattering of the electron beam, with respect to a fist pattern to be drawn or a second pattern to be drawn, the second pattern being obtained by black/white reversing the first pattern into a plurality of said second regions, and setting a reference figure in one of said second regions in place of at least one of the patterns, the reference figure being based on the at least one of the patterns but being different from the pattern, while using the remaining patterns as reference figures;

a third step of determining an optimal electron beam exposure dose with respect to said representative figures determined in the first step by using the reference figures set in each of the second regions in the second step, when said representative figures in said plurality of small regions are to be drawn; and a fourth step of determining said optimal electron beam exposure dose for each of said patterns to be drawn in each of said plurality of first regions, in accordance with the determined dose for said representative figures in the corresponding first region.

12. A method according to claim 11, wherein said at least one representative figure corresponding to one of said first regions satisfies one of the conditions selected from the group consisting of:

(1) the center of the representative figure exists within the corresponding first region, and (2) the center of the representative figure coincides with the center of a corresponding first region or coincides with the center of a corresponding first region or coincides with the center of the area of the patterns to be drawn which are present in the corresponding first region, and said at least one representative figure corresponding to one of said second regions satisfies one of the conditions selected from the group consisting of:

(1) the representative figure has an area equal to a total area of all of the patterns to be drawn which are present in said one of said plurality of second regions, and (2) the representative figure has an area equal to a total area of all of the patterns to be drawn which are present in said one of said plurality of regions, and the center of the representative figure coincides with the center of a corresponding first region or coincides with the center of the area of the patterns to be drawn which are present in said one of said plurality of regions.

13. An electron beam lithographic method, wherein before desired patterns are drawn on a sample by radiating an electron beam thereon, an optimal electron beam exposure dose is obtained stepwise in a discrete manner based on the position of the electron beam with respect to said patterns to be drawn, and said patterns are drawn with the optimal electron beam exposure does, comprising:

a first step of dividing a lithographic region into a plurality of first regions, each having a size sufficiently smaller than a spread of backscattering positions in said plurality of first regions, the patterns to be drawn being included in the plurality of first regions;

a second step of dividing an entire region of a first pattern to be drawn or a second pattern to be drawn, the second pattern being obtained by converting the first pattern into a plurality of second regions, independently of the division of the lithographic region in the first step, and determining at least one representative figure representing the pattern to be drawn in at least one of the second regions;

a third step of determining an optimal electron beam exposure dose for the patterns to be drawn in each of said first regions formed in the first step, by using said representative figures obtained in the second step; and a fourth step of using said optimal electron beam exposure dose determined in the third step with respect to said representative positions of each of said first regions formed in the first step as said optimal electron beam exposure dose for each of the patterns to be drawn which are included in the plurality of second regions formed in the second step.

14. A method according to claim 13, wherein said at least one representative position corresponding to one of said first regions satisfies one of the conditions selected from the group consisting of:

(1) the representative position exists within the corresponding first region, and (2) the representative position coincides with the center of a corresponding first region or coincides with the center of the area of the patterns to be drawn which are present in the corresponding first region, and said at least one representative figure corresponding to one of said second regions satisfies one of the conditions selected from the group consisting of:

(1) the representative figure has an area equal to a total area of all of the patterns to be drawn which are present in said one of said plurality of second regions, and (2) the representative figure has an area equal to a total area of all of the patterns to be drawn which are present in said one of said plurality of second regions, and the center of the representative figure coincides with the center of a corresponding first region or coincides with the center of the area of the patterns to be drawn which are present in said one of said plurality of regions.

* * * * *